United States Patent
Luu

(10) Patent No.: US 9,748,864 B2
(45) Date of Patent: Aug. 29, 2017

(54) POWER SUPPLY CIRCUITS INCORPORATING TRANSFORMERS FOR COMBINING OF POWER AMPLIFIER OUTPUTS AND ISOLATION OF LOAD VOLTAGE CLAMPING CIRCUITS

(71) Applicant: MKS Instruments, Inc., Andover, MA (US)

(72) Inventor: Ky Luu, Victor, NY (US)

(73) Assignee: MKS Instruments, Inc., Andover, MA (US)

( * ) Notice: Subject to any disclaimer, the term of this patent is extended or adjusted under 35 U.S.C. 154(b) by 75 days.

(21) Appl. No.: 14/751,586

(22) Filed: Jun. 26, 2015

(65) Prior Publication Data

US 2015/0381057 A1 Dec. 31, 2015

Related U.S. Application Data

(60) Provisional application No. 62/019,119, filed on Jun. 30, 2014.

(51) Int. Cl.
*H02M 7/5387* (2007.01)
*H03F 3/21* (2006.01)

(52) U.S. Cl.
CPC .......... *H02M 7/5387* (2013.01); *H03F 3/211* (2013.01); *H03F 2200/537* (2013.01);
(Continued)

(58) Field of Classification Search
CPC ..... H02M 2001/346; H02M 2001/348; H02M 3/33561; H02M 7/5387
See application file for complete search history.

(56) References Cited

U.S. PATENT DOCUMENTS 5,438,498 A * 8/1995 Ingemi ............... H02M 3/3376
363/132
5,864,471 A * 1/1999 Kammiller ............ H02M 3/337
363/132
(Continued)

FOREIGN PATENT DOCUMENTS

| JP | 09-215188 A | 8/1997 |
| JP | 2012-253900 A | 12/2012 |
| KR | 10-1996-0027297 A | 10/1997 |

OTHER PUBLICATIONS

International Search Report for International App. No. PCT/US2015/038338 dated Sep. 22, 2015, 3 pages.
(Continued)

*Primary Examiner* — Harry Behm
(74) *Attorney, Agent, or Firm* — Harness, Dickey & Pierce, P.L.C.

(57) ABSTRACT

A power supply circuit includes a power amplifier that receives a direct current (DC) voltage from a first power source. A control signal applied to the power amplifier causes the power amplifier to convert the DC voltage to an alternating current (AC) output signal. The AC output signal is applied to a transformer that includes a first winding, a second winding, and a third winding. The first winding receives the AC output signal and the second winding receives an output current that varies in accordance with the AC output signal to apply current to a load. A rectifier includes a plurality of diodes configured to rectify a voltage across the third winding and clamp the voltage at the load. Return power from the third winding may be returned to the first power source.

28 Claims, 29 Drawing Sheets

(52) U.S. Cl.
CPC .......... *H03F 2200/541* (2013.01); *H03F 2203/21142* (2013.01); *H03F 2203/21151* (2013.01)

(56) References Cited

U.S. PATENT DOCUMENTS

| | | | | |
|---|---|---|---|---|
| 6,469,919 | B1* | 10/2002 | Bennett | H01J 37/32082 363/132 |
| 6,501,194 | B1* | 12/2002 | Jiang | H02J 9/062 307/104 |
| 6,873,138 | B2* | 3/2005 | Jacobson | H01Q 3/30 323/232 |
| 9,408,288 | B2 | 8/2016 | Valcore, Jr. et al. | |
| 2002/0181253 | A1 | 12/2002 | Watanabe | |
| 2010/0315839 | A1* | 12/2010 | Yang | H02M 3/33576 363/17 |
| 2012/0147631 | A1 | 6/2012 | Nate | |
| 2015/0381057 | A1* | 12/2015 | Luu | H02M 7/5387 363/21.01 |

OTHER PUBLICATIONS

International Preliminary Report and Written Opinion of the International Searching Authority for International App. No. PCT/US2015/038338 dated Jan. 3, 2017, 5 pages.

\* cited by examiner

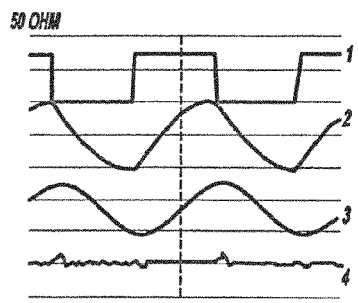
Figure 27A
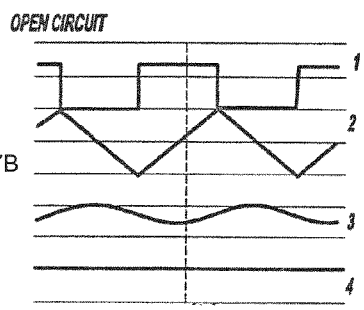
Figure 27B
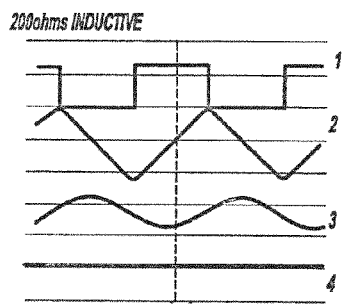
Figure 27E
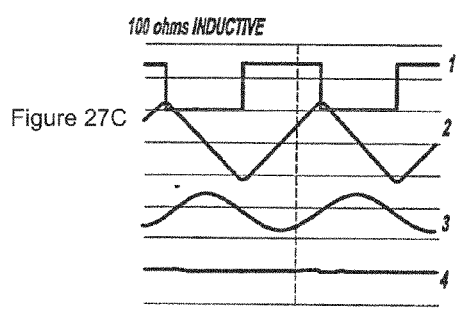
Figure 27C
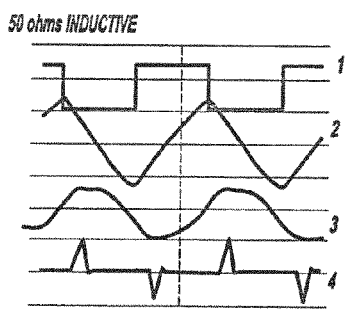
Figure 27F
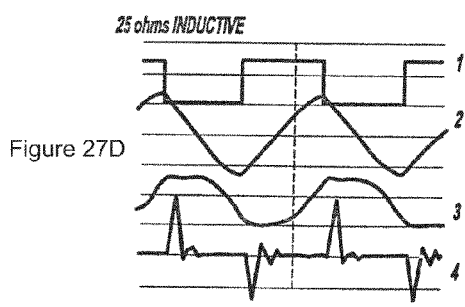
Figure 27D
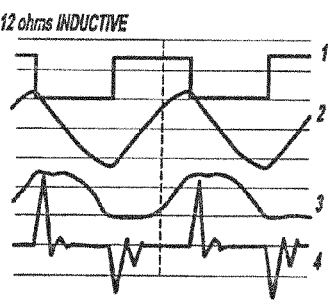
Figure 27G
Figure 27A-27G

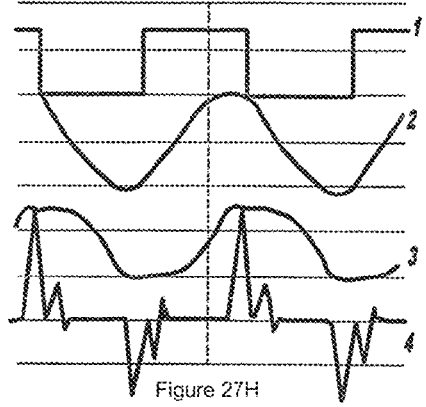
Figure 27H
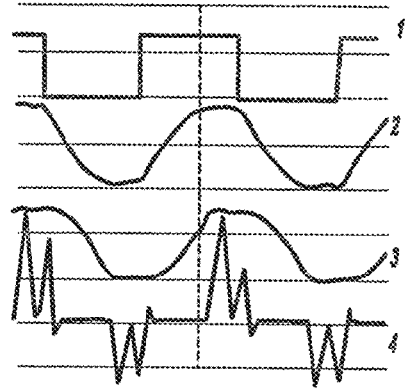
Figure 27K
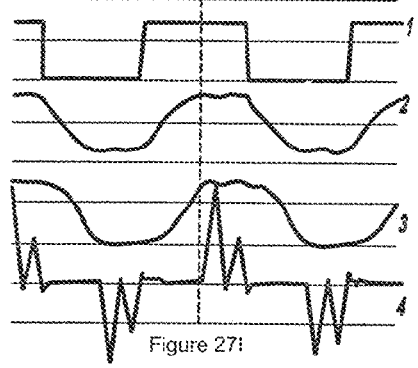
Figure 27I
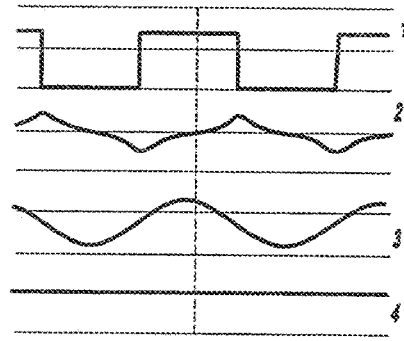
Figure 27L
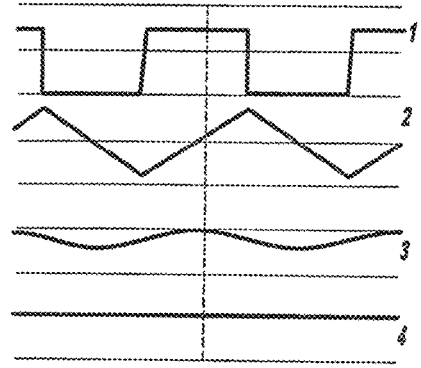
Figure 27J
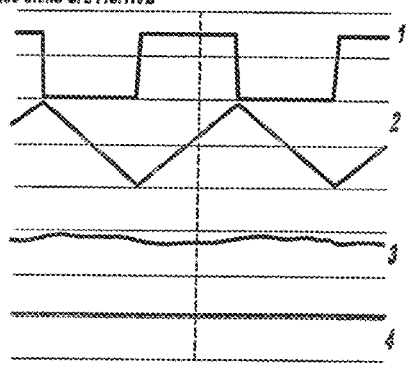
Figure 27M
Figure 27H-27M

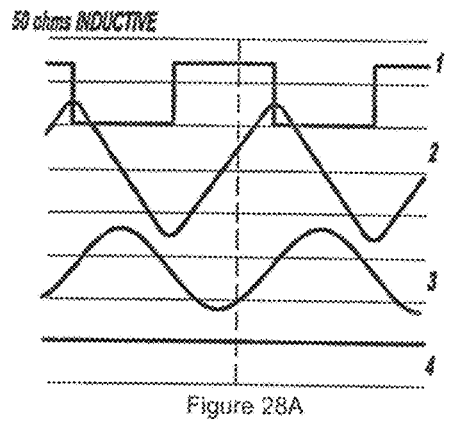
Figure 28A
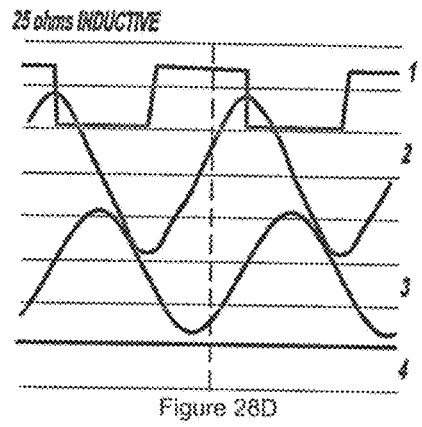
Figure 28D
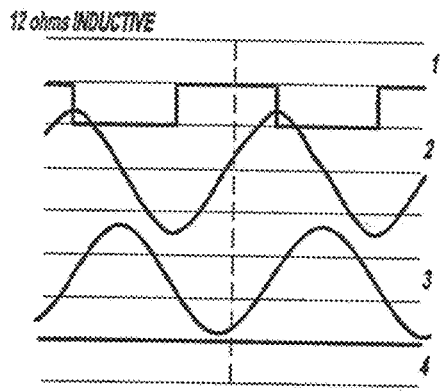
Figure 28B
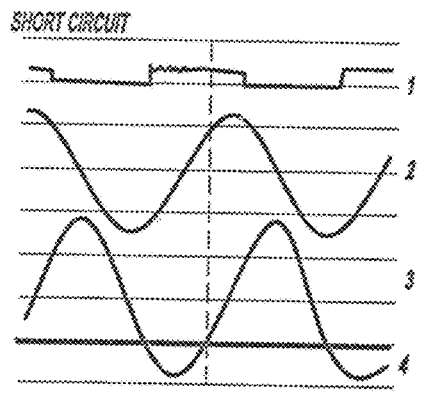
Figure 28E
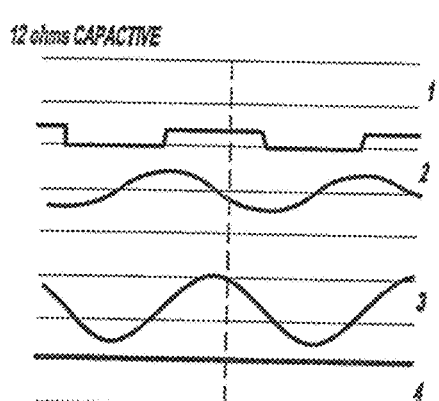
Figure 28C
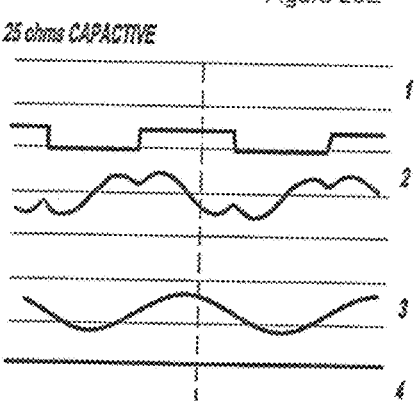
Figure 28F
Figure 28A-28F

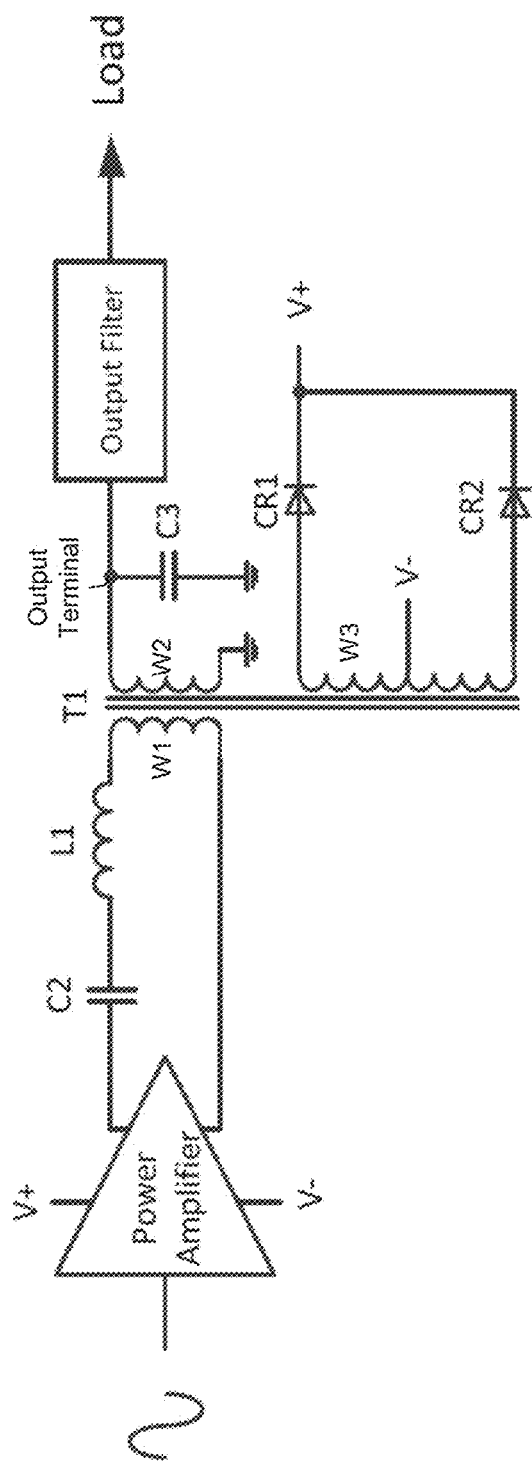
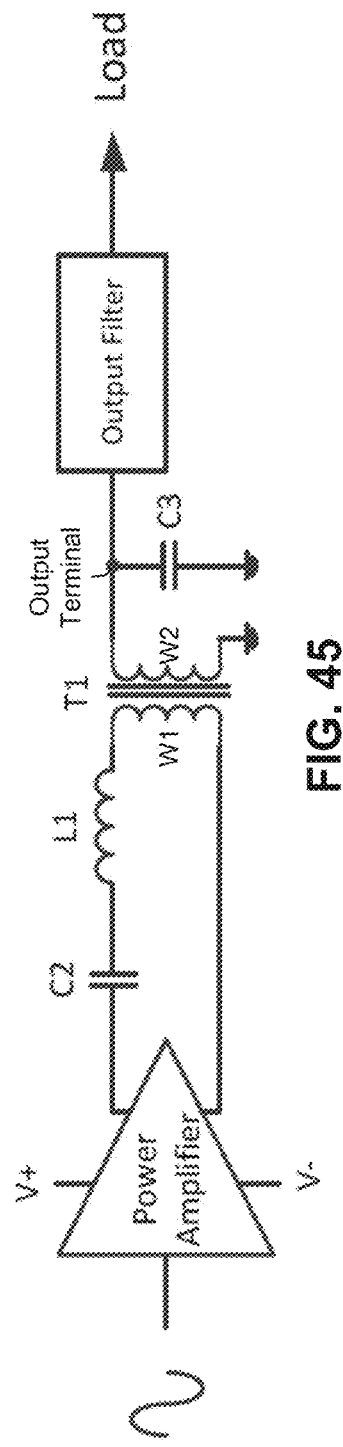
FIG. 44
FIG. 45

POWER SUPPLY CIRCUITS INCORPORATING TRANSFORMERS FOR COMBINING OF POWER AMPLIFIER OUTPUTS AND ISOLATION OF LOAD VOLTAGE CLAMPING CIRCUITS

FIELD

This disclosure relates generally to power supplies for supplying alternating power and, more particularly, to circuits for protecting power amplifiers of the power supplies.

BACKGROUND

Radio frequency (RF) energy is used in various industries for the treatment of materials through induction heating, dielectric heating, and plasma excitation. Plasma excitation can take the form of inductive, capacitive, or true electromagnetic (EM) wave, microwave, couplings. Generators which provide this RF energy utilize many circuit topologies ranging from single class A transistor amplifiers providing a few tens of watts to self-oscillating tube (valve) generators providing many thousands of watts.

The semiconductor manufacturing industry utilizes RF plasmas for depositing and etching micron and sub-micron sized films. A typical power supply for this application may consist of a line frequency transformer/rectifier/capacitor DC power supply and high frequency power amplifier. Typical power and frequency values may be up to 20 KW within the range of 400 KHz to 100.0 MHz, but may not be so limited. A power supply or generator would have power controllable to 1 or 2% precision over a 100:1 output load range. Usually the generator is specifically configured to output to a defined load, usually 50 ohms, but should be able to drive any load, even if mismatched, without failure. If a mismatch condition (e.g., increase in load impedance) and/or other condition arises such that current draw from the power amplifier and supplied to the load exceeds a certain threshold, damage can occur to the power amplifier over time. Typical protection schemes reduce the power. For example, the drive level to a linear amplifier is reduced to correspondingly reduce current or power dissipation. In a 50 ohm system, variation from the typical 50 ohms can be measured as reflected power. The drive level is reduced to limit reflected power.

FIG. 1 shows a typical transformer-coupled push-pull RF power amplifier having switches or transistors S1, S2 driven by sine waves which are out of phase. A five element harmonic rejection filter includes inductors L1, L2 and capacitors C1, C2, and C4. The harmonic rejection filter typically ensures a high purity or uniform sine wave output. No biasing schemes are shown which may be class AB or class B. Either bipolar junction transistors (BJTs) or metal oxide semiconductor field effect transistors (MOSFETs) are typically used. The transformer T1 has a ratio chosen to match the required power for a given DC supply voltage, usually 28V or 50V. Detailed circuitry follows standard industry practice for broadband HF/VHF power amplifier design as would be used for communications.

The amplifier of FIG. 1 offers one advantage, but several disadvantages. The advantage is that in a broadband design, the output frequency is easily changed simply by varying the drive or input frequency. For a given output frequency, only the output filter needs to be changed. If the basic linearity/purity of the amplifier is good enough, dispensed with altogether. The circuit of FIG. 1 has the disadvantages of poor efficiency and high transistor power dissipation. Efficiency theoretically cannot exceed 70% but typically is no better than 50%. To address the high power dissipation, many applications use expensive, special RF transistors which often employ beryllium oxide (BEo) low thermal resistance technology. This often requires large air or water cooled heatsinks. There is a large amount of data published on RF linear amplifier design. Any power supply manufacturer desiring to design a generator can use the transistor manufacturer's application circuit with a high degree of confidence.

As can be seen in FIG. 2, the circuit of FIG. 2 utilizes a different mode of operation offering high efficiency and low power dissipation. The drive signals in the circuit of FIG. 2 are fixed at square waves so that the transistors are now in a switching rather than a linear mode of operation. That is, the switches or transistors S1, S2 of FIG. 1 operate in a region between fully off and fully on. The switches or transistors S1, S2 of FIG. 2 operate by switching from fully on to fully off. The output of transformer T1 is now a square wave. A four element filter including inductors L1, L2 and capacitors C1, C2 filters out the required fundamental frequencies to yield a sinusoidal output. Capacitor C4 is removed so that the filter provides an inductive input, in order to reject harmonic current. Although the transistor and transformer voltages are square, the currents are sinusoidal. Efficiency can now be 100%, and typically falls within the range of 80-95%. Such a circuit is usually referred to as a resonant converter or inverter rather than an amplifier.

The circuit of FIG. 2 suffers some disadvantages. The filter is sufficiently selected for a particular output frequency so that only a fixed or narrow frequency range or band of operation is possible. Also, the output power cannot be directly controlled. Unlike, FIG. 1, the circuit of FIG. 2 cannot connect directly to a line or outlet voltage. Rather, the DC input to FIG. 2 requires regulation using an additional power converter, typically implemented using a switched mode converter. Further, mismatch loads can cause high circulating currents between the filter and transistors. The circulating currents are not necessarily limited by limiting the DC input current.

With particular respect to class E amplifiers, a class E amplifier is a switch-mode amplifier topology offering high efficiency. Because of its topology, the switch element, typically a transistor, of the class E amplifier spends little or no time in the active region where the greatest power dissipation occurs. In this configuration, the switch element of the class E amplifier operates more like a switch rather than a transistor. That is, the switching element spends the majority of its time in either the cutoff or the saturation regions.

Designers further improve the efficiency of the class E amplifier by using a switch-mode technique known as the zero-voltage switching (ZVS). ZVS prevents the switch element of the class E amplifier from passing through the active region during transitions. By applying an inductive load at the output of the switch element, the parasitic and swamping capacitances at the output of the switch element are discharged to zero volts before the switch element attempts to transition from the cutoff region to the saturation region. An inductor and a capacitor cooperate to form a series-resonant circuit and provide an inductive load at an output of the switch element. The frequency of the resonant circuit is less than the operating frequency of the amplifier. When this occurs, the inductor of the resonant circuit dominates the resonant circuit and generates an inductive load on the transistor.

In order to perform ZVS, the switch element must be designed to permit negative drain-source current to pass through it, even if the device channel is in the cutoff region. Such a requirement suggests that a MOSFET is a preferred selection for the switch element of the class E amplifier topology because MOSFETs have an intrinsic body diode at the substrate connection to the source. Other transistors may be selected, such as a bipolar junction transistor (BJT) or an integrated gate bipolar transistor (IGBT), but such a configuration requires that a fast diode be placed across the emitter-collector junction.

The primary benefit of the class E amplifier is that more RF power can be realized from the same transistor used in a class E topology versus other topologies, primarily due to reduced device dissipation. On the other hand, the class E amplifier generates substantial second harmonic energy that must be removed from the RF output. Such topologies typically require at least one additional stage of filtering before the RF power is delivered to the load.

As discussed previously, the series-resonant circuit consisting of an inductor and a capacitor possess a resonant frequency below the amplifier operating frequency. Although the load could be any combination of capacitors, inductors, and resistors, if the load is only a capacitor with a value such that the series combination of the resonant circuit and the load has a resonant frequency equal to the amplifier operating frequency, the current through the switch element could approach an infinite value. This could result in damage to the transistor. Typical class E amplifier applications, however, avoid transistor damage by utilizing an external control loop that clamps the amplifier output reflected power. Once the control loop senses that the reflected power has exceeded a preset limit, the control loop reduces the voltage at the DC rail until the reflected power matches a predetermined limit. The control loop must react quickly in order to avoid impact to the transistor. Impact to the transistor can also be avoided by reducing the RF amplifier input power to zero. However, in a plasma processing application, such an action may cause the undesirable result that the plasma is extinguished.

SUMMARY

A power supply circuit including a power amplifier configured to receive (i) a direct current (DC) voltage from a first power source, and (ii) a control signal. Based on the control signal, the power supply converts the DC voltage to an alternating current (AC) output signal. A transformer includes a first winding, a second winding, and a third winding. The first winding receives the AC output signal. The second winding receives an output current based on the AC output signal supplies current to a load via an output terminal. A rectifier and clamping circuit includes a plurality of diodes. The diodes are configured to rectify a voltage across the third winding, clamp a voltage at the output terminal, and return power from the third winding to the first power source or a second power source.

A power supply circuit includes a power amplifier that receives a direct current (DC) voltage from a first power source and converts the DC voltage to an alternating current (AC) output signal. A transformer includes a first winding, a second winding, and a third winding. The first winding receives the AC output signal. The second winding receives an output current based on the AC output signal and supplies current to a load via an output terminal. A rectifier and clamping circuit includes a plurality of diodes. The diodes are configured to at least two of rectify a voltage across the third winding, clamp a voltage at the output terminal, and return power from the third winding to the first power source or a second power source.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

FIGS. 27A-27M illustrate waveforms taken from an exemplary half bridge inverter incorporating a protection circuit;

FIGS. 28A-28F illustrate comparative waveforms from an exemplary half bridge inverter not incorporating a protection circuit;

FIG. 29 is a block diagram of a control circuit for a power supply;

FIG. 44 illustrates another power supply circuit incorporating a power amplifier and an isolated dual-diode rectification and clamping circuit in accordance with the present disclosure;

FIG. 45 illustrates a power supply circuit without voltage rectification and clamping;

In the drawings, reference numbers may be reused to identify similar and/or identical elements.

DETAILED DESCRIPTION

The following description of the preferred embodiment(s) is merely exemplary in nature and is in no way intended to limit the disclosure provided herein, its application, or uses.

Figure 3:
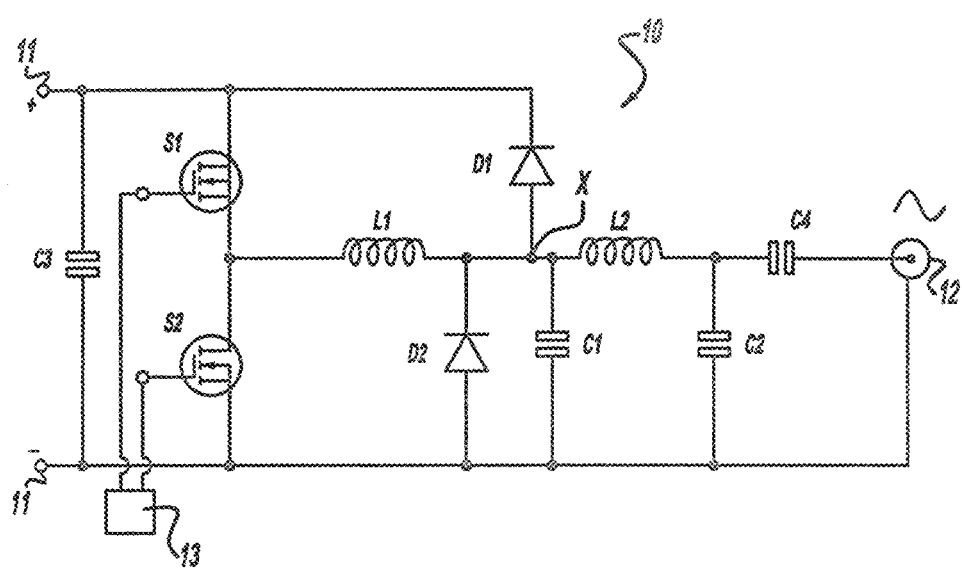
FIG. 3 is a power supply circuit.

With reference to FIG. 3, a voltage inverter circuit is generally indicated at 10 and has a direct current (DC) voltage source input at 11 and an alternating current (AC) output at 12. It should be noted from the outset that in describing the figures, switches will generally be referred to using S followed by a number; capacitors will be referred to using C followed by a number; inductors will be referred to using L followed by a number; diodes will be referred to using D followed by a number; and transformers will be referred to using T followed by a number. Further, in circuits which have a generally symmetric topology, each of the above reference symbols may be followed by a letter suffix to indicate generally similar, symmetric elements.

Switches S1, S2 receive as input respective out of phase square wave signals from a signal source or generator 13. The square wave signals turn on switches S1, S2 in a manner to reverse the polarity of the voltage across inductor whenever either L1 switch S1 or S2 is turned on. When signal source 13 drives switches S1, S2 in such a manner, switches S1, S2 and capacitor C3 cooperate to invert the DC input signal to an AC signal which is applied to inductor L1. This creates the alternating output at 12, with DC components being blocked by capacitor C4. The frequency of the output signal at 12 depends upon the frequency of the signals output by signal source 13. A four element harmonic filter comprising inductors L1, L2 and capacitors C1, C2 operate generally as described above. Inductor L1 and capacitor C1 form a first stage of the harmonic filter and inductor L2 and capacitor C2 form a second stage of the harmonic filter. The output filter removes harmonic components of the signal input to inductor L1 to improve the purity of the output sign wave and matches the required output power for a given input voltage to the output impedance, which is typically 50 ohms.

Figure 1:
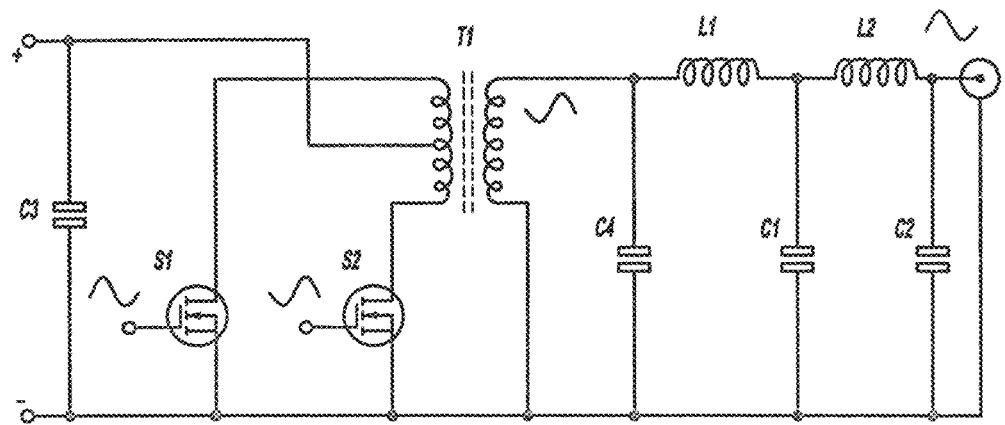
FIGS. 1 and 2 are circuit topologies practiced in the prior art, as described above.
Figure 2:
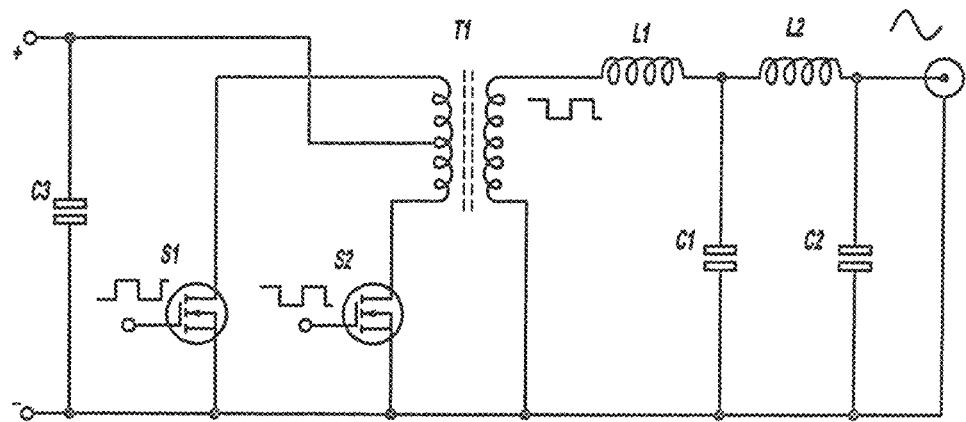

As discussed above, the circuit of FIGS. 1 and 2 could be highly vulnerable to high circulating currents created by mismatch loads. A pair of clamping diodes or rectifiers D1 and D2 inserted between the first and second stage harmonic filters alleviates potential damage due to circulating currents. Diode D2 extends from the negative rail of DC input source 11 up to a node X. Diode D1 extends from node X to the positive rail of DC input source 11. In operation, if the circuit attempts to drive the node X beyond the rail voltage, in one direction or the other, then the diode associated with that rail will turn on and become conductive. When the diode turns on, the diode clamps node X to the rail voltage and feeds back the excess voltage and/or current into the inverter, particularly input source 11 and capacitor C3. More particularly, if the circuit attempts to drive node X above the voltage at the positive rail of the DC input 11, diode D1 turns on providing a current path including the body diode of switch S2 back to the DC input voltage source 11 and capacitor C3. Similarly, if the circuit attempts to drive node X below the negative rail of DC source 11, diode D2 becomes conductive, providing a current path back including the body diode of switch S1 to DC input source 11 and capacitor C3. As the effects of mismatch loads increase with frequency, the circuit of FIG. 3 enables an inverter to be used at frequencies which were previously difficult to achieve.

Figure 4:
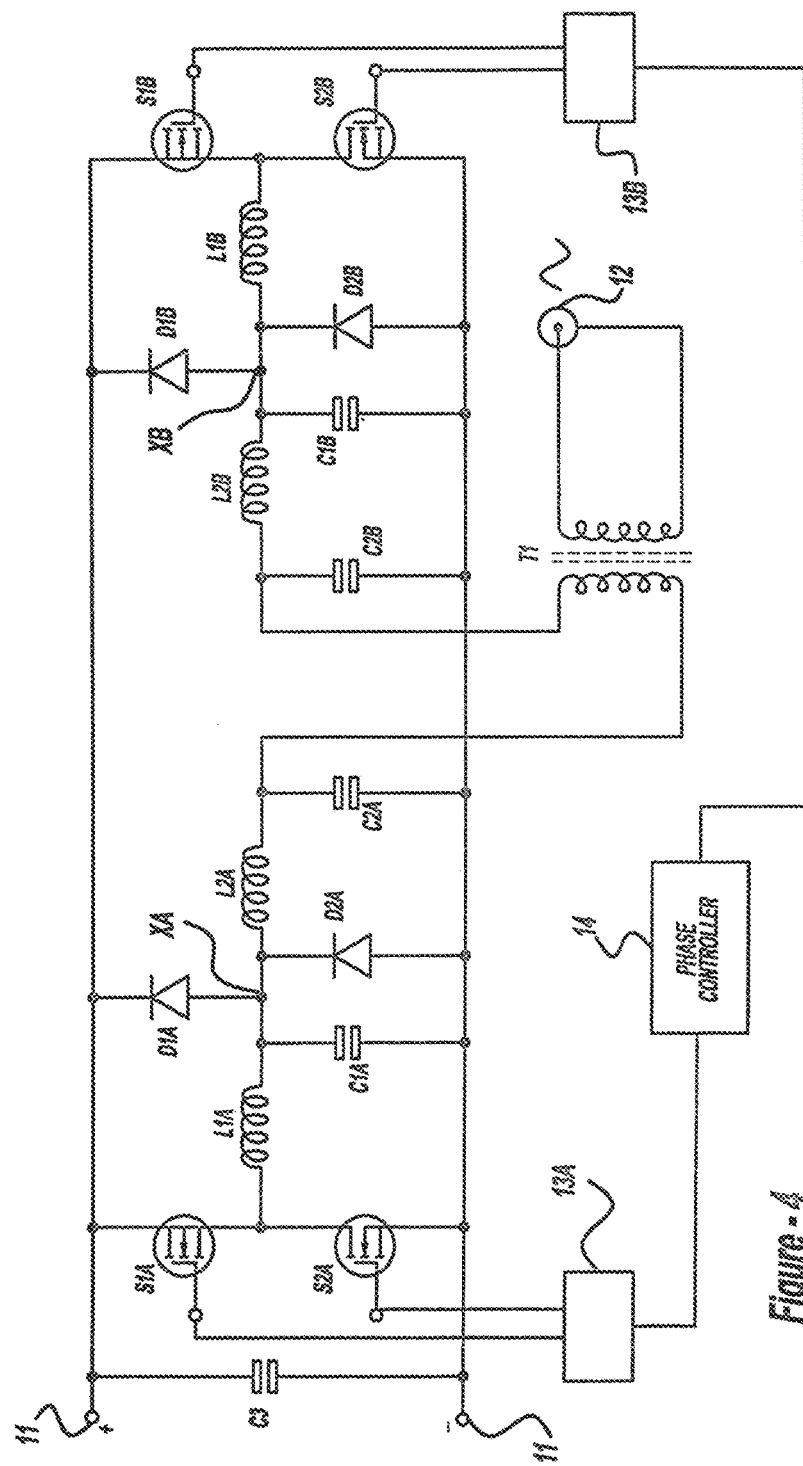
FIG. 4 illustrates circuits connected in series to produce a combined output.

FIG. 4 illustrates the output of two power supply circuits placed in series. FIG. 4 includes two halves A and B arranged in a full-bridge configuration. The circuit of FIG. 4 enables adjustment of power at output 12 by varying the phase between the switching signals applied to each of the two halves A and B.

A first half of FIG. 4 includes a pair of switches S1A, S2A which receive a pair of AC signals output by signal source 13A. Switches S1A, S2A are connected in series between the negative and positive voltage rails of a DC power source 11. The output from switches S1A, S2A is applied to inductor L1A, which forms a two stage, four element harmonic filter in combination with inductor L2A and capacitors C1A, C2A. A first clamping diode D1A has a negative terminal or cathode connected to the positive rail of DC input source 11 and a positive terminal or anode connected between inductors L1A, L2A. A second clamping diode D2A has a positive terminal or anode connected to the negative terminal of DC source 11 and a negative terminal or cathode connected to the positive terminal of clamping diode D1A. The output from the harmonic filter is connected to a first end tap of transformer T1.

Clamping diodes D1A, D2A provide protection to the left half of the circuit of FIG. 4. When the circuit attempts to drive the voltage at node XA above the positive rail of DC source 11, diode D1A becomes conductive, thereby clamping the voltage at node XA to approximately the positive rail voltage of DC input source 11, and providing a path back to DC input source 11 and capacitor C3. Similarly, when the circuit attempts to drive node XA below the negative rail voltage of DC input source 11, diode D2A turns on, clamping the voltage at node XA to approximately the negative rail voltage of DC input source 11 and provides a circuit path back to DC input source 11 and capacitor C3, thereby protecting the left half of the circuit of FIG. 4.

The circuit of FIG. 4 also includes a second half, half B, which includes switches S1B, S2B. A signal source 13B outputs a pair of AC signals to switches S1B, S2B. It should be noted that signal sources 13A, 13B may be combined into a single unit. Half B also includes a four element, two stage harmonic filter comprising inductors L1B, L2B and capacitors C1B, C2B. Half B also includes a pair of clamping diodes D1B, D2B arranged in half B as described in half A. The output from circuit half B is connected to an end tap of transformer T1. Circuit half B operates as described with respect to circuit half A. Transformer T1 provides isolation between circuit halves A and B and the output 12. Circuit halves A and B are connected in series through the input coil of transformer T1.

Circuit halves A, B are combined in series such that altering the phase between the switching signals controlling each half varies the power at output 12. In particular, when switch S1A and switch S1B are actuated and deactuated at the same times, switches S1A, S1B are said to operate in phase or at 0 degrees phase. Conversely, if switch S1A is off whenever switch S1B is on and switch S1A is on whenever switch S1B is off, the switches are said to be out of phase or at 180 degrees phase. Similar terminology applies to each of switches S2A, S2B. The phase between each circuit half A, B is determined by a phase controller 14 which provides an output signal to each of signal sources 13A, 13B in order to vary the relative phases between each circuit half. Maximum power at output 12 results when circuit halves A and B are operated at 180 degrees phase or out of phase. Minimum power at output 12 results when circuit halves A and B are operated at 0 degrees phase or in phase. When the phase is zero, each half sees an open circuit regardless of the load impedance. Transformer T1 combines the outputs effectively in series, and no blocking capacitors are required before output 12. The circuit components forming the harmonic filter in each circuit half A and B must be matched or equal to ensure zero output at 0 degrees phase. For example, the values for L1A, L2A, C1A, and C2A should be equal the values for L1B, L2B, C1B, and C2B.

Figure 5:
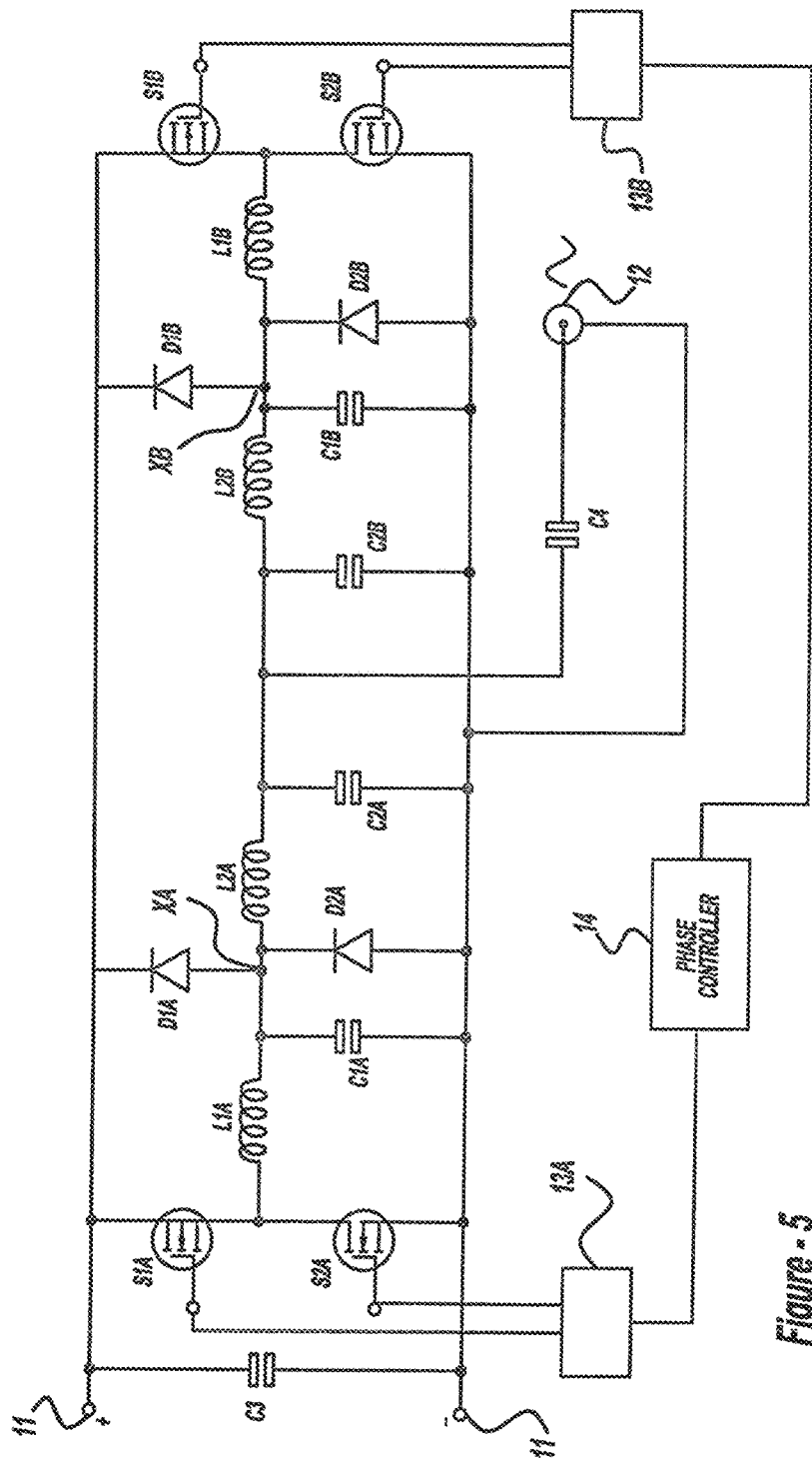
FIG. 5 illustrates circuits connected in parallel to produce a combined power output.

FIG. 5 illustrates a first circuit half A and a second circuit half B combined in parallel. Circuit half A includes a pair of switches S1A, S2A which receive respective AC input signals from signal generator 13A, which may be combined with signal source 13B to form a single unit. Switches S1A, S2A are connected in series between the respective positive and negative rails of DC input source 11. The output from switches S1A, S2A is applied to a four element, two stage harmonic filter comprising inductors L1A, L2A and capacitors CIA, C2A.

A pair of clamping diodes D1A, D2A are arranged in series between the respective positive and negative rails of DC input source 11. The negative terminal or cathode of diode D1A connects to the positive rail of DC source, and the positive terminal or anode of diode D1A connects to node XA. The negative terminal or cathode of diode D2A connects to node XA, and the positive terminal or anode of diode D2A connects to the negative rail of DC power source 11. The output from circuit half A is determined in accordance with the voltage between the negative rail of DC input source 11 and the output from the four element filter. The output from the filter is applied to a blocking capacitor C4, which blocks any DC component of the output signal. Capacitor C4 also connects to the output 12. In operation, clamping diodes D1A, D2A protect the circuit elements of circuit half A by providing a circuit path to DC input source 11 and capacitor C3 when the circuit attempts to drive node XA beyond a predetermined threshold defined by each of the respective negative and positive rails of DC source 11.

Circuit half B is similarly arranged to and operates in the same manner as circuit half A. In a parallel connection of circuit halves A, B, as shown in FIG. 5, varying the phase of operation between each respective half A, B varies the power at output 12. In particular, when switch halves A, B are operated at 0 degrees or in phase, maximum power is generated at output 12. Conversely, when the switch halves A, B are operated at 180 degrees or out of phase, a short circuit appears, and a minimum power appears at output 12. A phase controller 14 provides a control signal to each of signal generators 13A, 13B in order to control the relative phases between each circuit half A, B. With the phase at 180 degrees each circuit half now sees a short circuit regardless of load impedance. Note that because capacitors C2A and C2B are in parallel, they can be combined into a single component. The circuit components forming the harmonic filter in each circuit half A and B must be matched or equal to ensure zero output at 180 degrees phase. For example, the valves for L1A, L2A, C1A, and C2A should be equal the values for L1B, L2B, C1B, and C2B.

Figure 6:
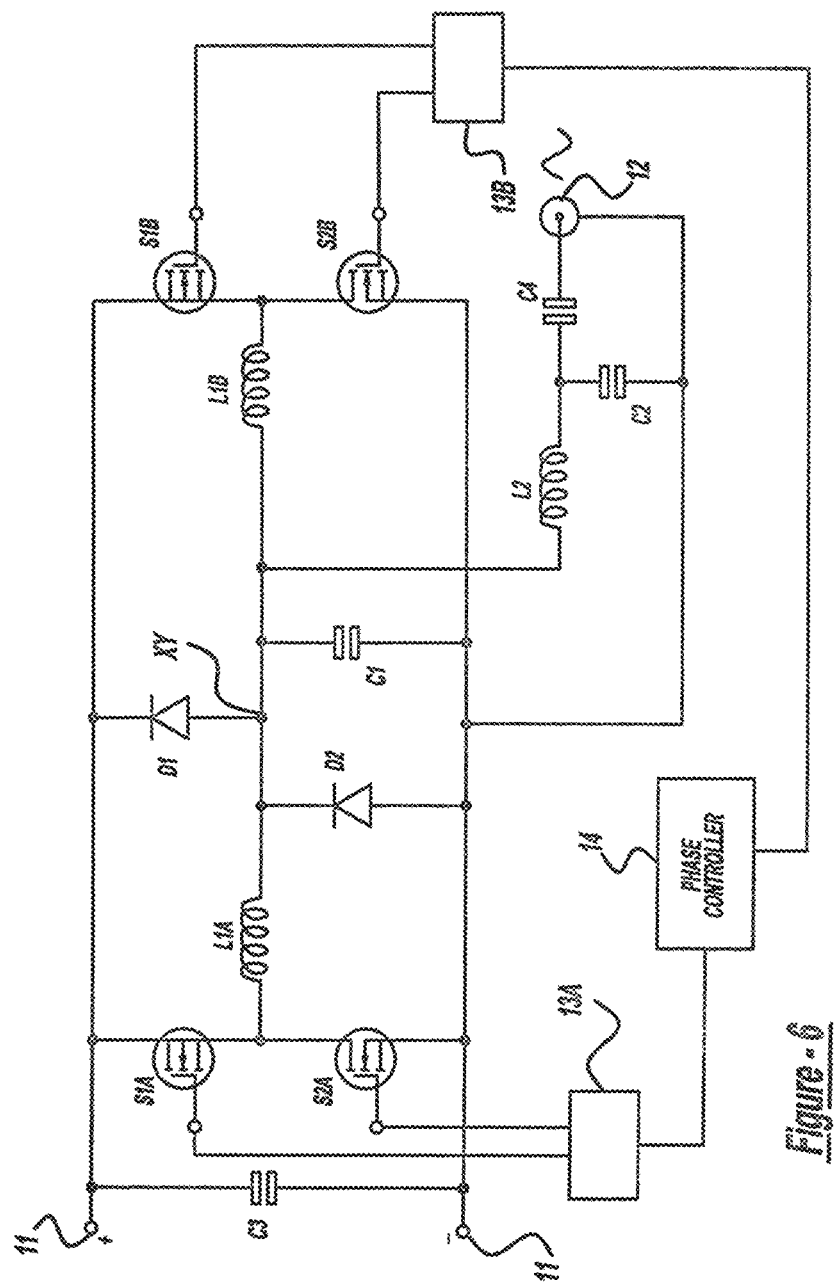
FIG. 6 illustrates half of a switching bridge protected by a single clamping diode pair.

FIG. 6 depicts a circuit having circuit halves A, B which cooperate to apply signals to common elements prior to output 12. Circuit half A includes a pair of switches S1A, S2A arranged in parallel between the respective positive and negative voltage rails of DC input source 11. The output from switches S1A, S2A are input to an inductor L1A. A signal source or generator 13A outputs AC signals which control actuation of switches S1A, S2B. Circuit half B includes a pair of switches S1B, S2B arranged in series between the respective positive and negative voltage rails of DC input source 11. The output from switches S1B, S2B are input to inductor L1B. A signal source or generator 13B, which may be combined with signal source 13A into a single unit, provides AC signals to control actuation and deactuation of each respective switch S1B, S2B.

A pair of clamping diodes D1, D2 are arranged in parallel with the respective switch pairs S1A, S2A and S1B, S2B. Clamping diodes D1, D2 provide a circuit path back to DC input source 11 and capacitor C3 when either circuit half A, B attempts to drive node XY beyond a predetermined voltage defined by the respective positive and negative rails of DC input source 11.

Capacitor C1 is arranged between the negative voltage rail of DC source 11 and node XY. The voltage between the negative rail of DC source 11 and node XY defines an input voltage to a filter defined by inductor L2 and capacitor C2, which forms a second stage of the harmonic filter formed by inductors L1A, L2B, L2 and capacitors C1, C2. Capacitor C1 cooperates with each of respective inductors L1A, L2B to provide a first stage of harmonic filter. A blocking capacitor C4 removes DC components of the signal prior to output at output 12.

Clamping diodes D1, D2 provide a circuit path back to DC input source 11 and capacitor C3 when either circuit half A, B attempts to drive node XY above the positive voltage rail of DC source 11 or below the negative voltage rail of DC source 11. Thus, regardless of what circuit half A, B drives node XY beyond the above-described predetermined thresholds, clamping diodes D1, D2 operate to protect the circuit of FIG. 6 by providing a circuit path back to DC source 11 and capacitor C3.

The circuit of FIG. 6 also includes a phase controller 14 for controlling the relative phases between circuit halves A, B by generating control signals to each of respective signal sources 13A, 13B. In FIG. 6, maximum power is provided at output 12 when switch halves A, B operate in phase or at zero degrees phase, and minimum power is provided at output 12 when circuit halves A, B operate out of phase or at 180 degrees phase. In the circuit of FIG. 6, inductors L1A and L1B must be matched to ensure zero output at 180 degrees phase.

Figure 7:
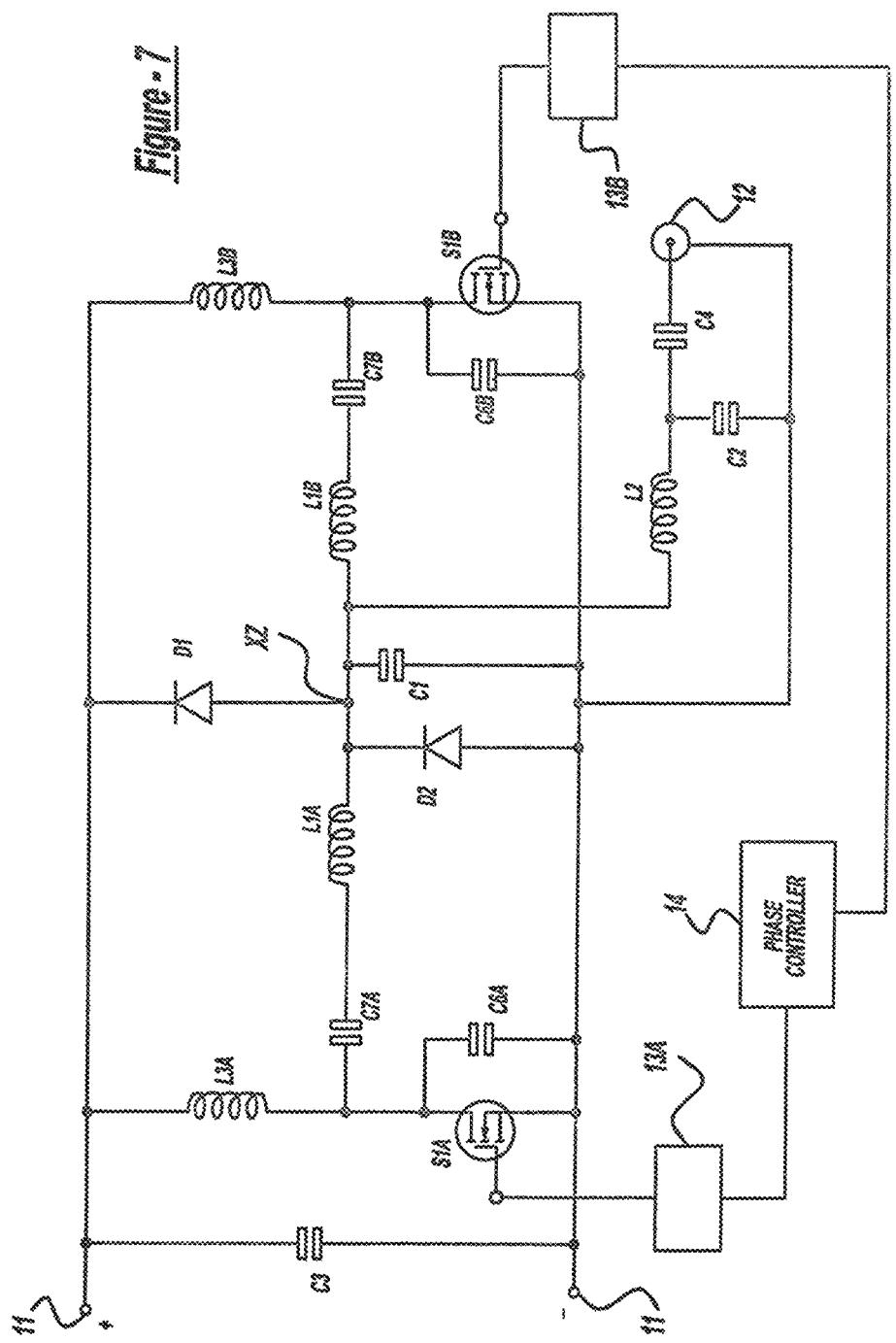
FIG. 7 illustrates a resonant circuit and single switch providing an output and a single diode clamping pair protecting the circuit.

FIG. 7 depicts a circuit having circuit halves A, B which are combined in parallel to provide an AC signal at output 12. With reference to circuit half A, switch S1A receives an AC signal from signal source 13A. Switch S1A is placed in series with a commutating inductor L3A between the respective negative and positive voltage rails of DC power source 11. A capacitor C6A is placed in parallel with switch S1A. Commutating inductor L3A and capacitor C6A cooperate to form a tank circuit so that circuit half A provides a single-ended inverter function. The tank circuit outputs a half-rectified sine waveform. A blocking capacitor C7A removes DC components from the signal output from switch S1A and commutating inductor L3A. Capacitor C7A couples the AC together and ensures the same AC voltage across each device, as will be seen in FIG. 8. Note that L3A and L3B can be cross coupled to promote equal sharing. The ratio inductors L3A to L1A determines the variation of stress of switch S1A. If the current through inductor L3A is relatively large compared to that through inductor L1A then the variation due to the load through inductor L1A will have a limited effect on the stress on switch S1A. The circuit of FIG. 7 has the disadvantage that even harmonics are generated and the DC voltage across C7A has some dependence on the load. This means a transient charging current may flow under some load changes. Output from blocking capacitor C7A is input to inductor L1A.

Second switch half B includes a switch S1B driven by an AC signal output by signal source 13B. Switch S1B is in series with commutating inductor L3B between the respective negative and positive rails of DC input source 11. A capacitor C6B is placed in parallel with switch S1B. Commutating inductor L3B and capacitor C6B form a tank circuit. The output from switch S1B and inductor L3B is applied to blocking capacitor C7B, which removes DC components from the signal. Inductor L1B connects to capacitor C7B.

Inductors L1A and L1B interconnect at node XZ and provide an output to inductor L2 and capacitor C2. The other terminal capacitor C2 is connected to the negative rail of DC voltage source 11. A capacitor C1 is connected between the negative rail of DC voltage source 11 and node XZ. Accordingly, inductors L1A, L2 and capacitors C1, C2 from a two-stage harmonic filter for the output from circuit half A. Similarly, inductors L1B, L2 and capacitors C1, C2 form a two-stage harmonic filter for the output from circuit half B. Blocking capacitor C4 removes DC components from the signal provided at output 12.

FIG. 7 also includes a pair of clamping diodes D1, D2 arranged in series between the respective positive and negative rails of voltage source 11. The negative terminal or cathode of diode D1 connects to the positive rail of DC source 11, and the positive terminal or cathode of diode D1 connects to node XZ. The negative terminal or cathode of diode D2 connects to node XZ, and the positive terminal or anode of diode D2 connects to the negative rail of DC source 11.

When either circuit half A, B attempts to drive the voltage at node XZ above a predetermined threshold, one of clamping diodes D1, D2 turns on, thereby providing a circuit path from node XZ back to DC source 11 and capacitor C3. For example, when the circuit of FIG. 7 attempts to drive node XZ to a voltage above the positive rail of DC source 11, diode D1 becomes conductive, thereby providing a circuit path for excess voltage and current back to DC input source 11 and capacitor C3. Similarly, when the circuit attempts to drive the voltage at node XZ below the voltage at the negative rail of DC input source 11, diode D2 becomes conductive, providing a circuit path back to DC input source 11 and capacitor C3.

The circuit halves A, B of FIG. 7 are arranged in a parallel configuration. When the relative phase of the control signals controlling switch S1A and switch S1B is in phase, or at 0 degrees, output 12 receives maximum power. Conversely, when the phase between the signals driving switch S1A and S1B are out of phase, or at 180 degrees, output 12 receives a minimum power. A phase controller 14 varies the relative phase between circuit halves A, B by providing an input to signal to each of signal sources 13A, 13B. The circuit components forming the harmonic filter in each circuit half A and B must be matched or equal to ensure 180 degree output phase. For example, L1A, L2A, C1A, and C2B should equal the values for L1B, L2B, C1B, and C2B.

A particular benefit of the circuit of FIG. 7 is that during operation at high frequencies, driving switches alternately within a same circuit path generally becomes more difficult. By utilizing a tank circuit formed by inductor L3 and associated capacitor C6, less precision is generally required of the switching on a particular circuit half.

Figure 8:
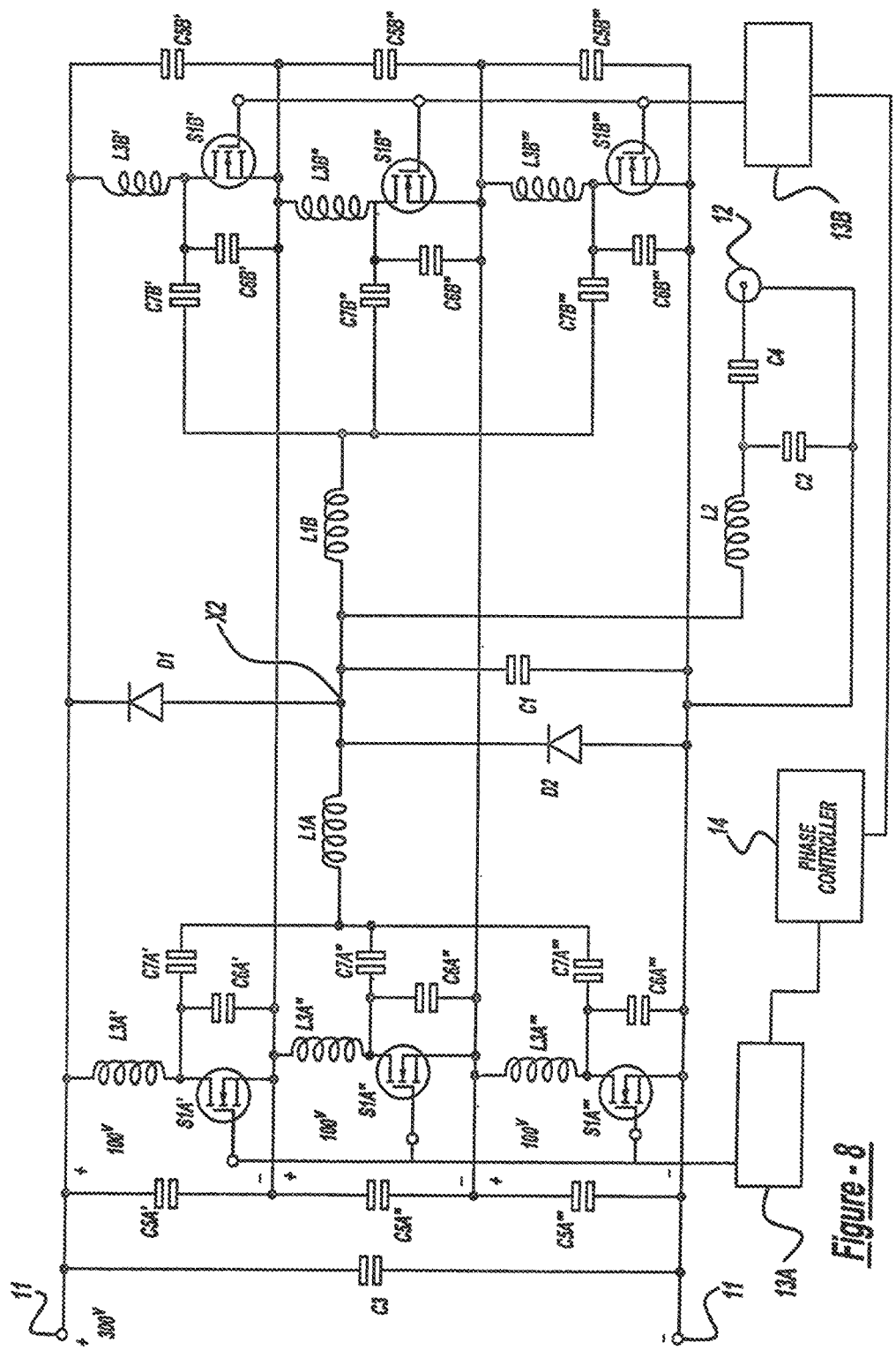
FIG. 8 is a three level implementation of the circuit of FIG. 7.

FIG. 8 depicts a three level implementation of the single-ended inverter circuit of FIG. 8. FIG. 8 includes a pair of circuit halves A, B, where each pair includes three levels designated by prime ('), double prime ("), and triple prime ('"). With reference to circuit half A, each level includes a switch S1A which receives an AC signal from signal source 13A. Switch S1A connects to an inductor L3A and is placed in parallel with the capacitor C6A. Inductor L3A and capacitor C6A cooperate to form a tank circuit. The output from inductor L3A and switch S1A is input to blocking capacitor C7A, which removes DC components from the output of conductor L3A and switch S1A. A capacitor C5A is placed in parallel with the series connection of switch S1A and inductor L3A. Each switch S1A', S1A", S1A'" receives analog signal from signal source 13A.

Capacitors C5A', C5A" C5A'" decouple the three levels. Each capacitor C5A', C5A", C5A'" passes current and blocks AC, thus providing a current loop for each DC portion of each stage. Capacitors C7A', C7A", C7A'" AC couple the outputs of each level together and have impedances which are negligible at the frequency of interest. Accordingly, each level has a voltage which is approximately equal. For example, if the voltage output by DC input source 11 is 300 volts, the voltage across each capacitor is 100 volts. Thus, each level of circuit half A must handle only ⅓ of the voltage output by DC source.

Similarly, circuit half B includes three levels, with each level having a switch S1B connected in series with an inductor L3B. Switch S1B is also connected in parallel with a capacitor C6B which forms a tank circuit with inductor L3B, as discussed above. A blocking capacitor C7B removes DC components from the output of inductor L3B and switch S1B. Each level is also connected in parallel with a capacitor C5B. The elements operate as described above with respect to circuit half A. Each switch S1B', 52B", 53B''' receives an AC signal from a signal generator 13B.

The output from the three levels of circuit half A is combined and input to inductor L1A. Inductor L1A cooperates to form a two-stage harmonic filter with inductor L2 and capacitors C1, C2 to remove harmonic components output from circuit half A. Similarly, the output from each level of circuit half B is combined and input to inductor L1B which also cooperates with inductor L2 and capacitors C1, C2 to form a two stage harmonic filter which removes harmonic components from the AC signal output from circuit half B. A blocking capacitor C4 is connected at the output of the harmonic filter to remove DC components in the signal provided to output 12.

FIG. 8 also includes a pair of clamping diodes D1, D2 arranged in series between the respective positive and negative voltage rails of DC input source 11. Clamping diodes D1, D2 cooperate to provide a circuit path back to DC source 11 and capacitor C3 when either circuit half attempts to drive node XZ beyond a predetermined threshold defined by the respective negative and positive rails of DC input source 11. In operation, when either circuit half attempts to drive node XZ to a voltage greater than the positive rail of DC input source 11, diode D1 turns on, creating a circuit path back to DC input source 11 and capacitor C3. Similarly, when either circuit half A, B attempts to drive the voltage at node XZ below the negative rail of DC input source 11, diode D2 turns on, creating a circuit path back to DC input source 11 and capacitor C3.

In operation, the relative phase between circuit halves A, B determines the power provided to output 12. When the relative phase between circuit halves A, B is 0 degrees or in phase, output 12 receives a maximum power. Conversely, when the relative phase between the AC signals driving the switches for the respective circuit halves A, B is 180 degrees, or out of phase, output 12 receives a minimum power.

A particular advantage of the circuit of FIG. 8 is that by placing three circuits in series between the respective negative and positive rails of voltage source 11, each level handles only one-third of the overall voltage across the respective negative and positive rails of DC source 11. This enables utilization of 400-500 volt devices for power supplies having DC input of approximately 300 volts, as only one-third of the input voltage is handled by each level, rather than the entirety of the voltage in a single level implementation. Such 400-500 volt devices are widely available and provide optimum characteristics for a 300 volt input system.

Figure 9:
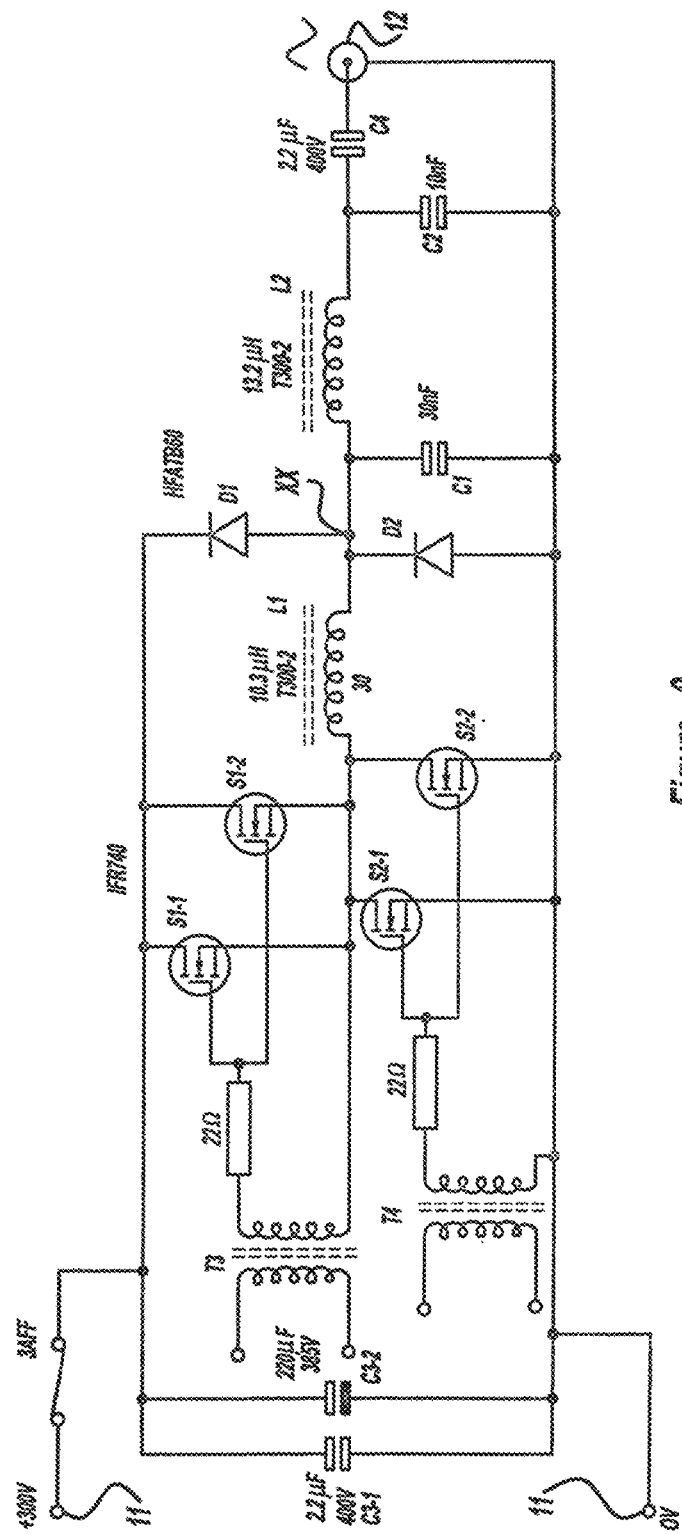
FIG. 9 illustrates a half bridge inverter and a protection circuit.

FIG. 9 shows a circuit diagram for an inverter having a protection circuit. A DC voltage of 300 volts is applied across the voltage rails of the circuit of FIG. 9. A first capacitor C3-1 is embodied as a 2.2 microfarad (mF) capacitor having a 400 volt (V) capacity and a second capacitor C3-2 is embodied as a 220 mF capacitor having a 380V capacity are placed in parallel between the voltage rails. A first AC signal is applied by a signal source (not shown) to the terminals of an isolation transformer T3. A second AC signal from the signal source (not shown) is applied to the input of a transformer T4.

The output from transformer T3 is input to a pair of switches S1-1, S1-2 through a 22 ohm (W) resistor. Similarly, the output from transformer T4 is input to a second switch pair S2-1, S2-2 through a 22 ohm (W) resistor. The switches are selected from an IRF740 package. The switch pair S1-1 and S1-2 are placed in parallel, as is the switch pair S2-1 and S2-2. Such parallel arrangement of the dual switches of a single switch pair reduces the current handling requirement of each switch. The output from the switch pairs S1, S2 is input to a 10.3 microhenry (mH) inductor L1 which cooperates with a 13.2 mH inductor L2 and a 30 nanofarad (OF) capacitor C1 and a 10 hF capacitor C2 to provide a four element harmonic filter for removing harmonics from the output of switches S1, S2. Blocking capacitor C4 is embodied as a 2.2 mF capacitor having a 400V capacity.

Clamping diodes D1 and D2 are arranged in series between the respective positive and negative rails of voltage of DC source 11. Clamping diodes D1, D2 are preferably selected from a package HFAT660.

The circuits described above typically operate over a limited range of frequency. Because the LC networks are generally low pass filters, maximum power throughput varies inversely with frequency. Also, as the frequency decreases, distortion from the harmonics will start to appear. Satisfactory operation over at least a 30% bandwidth has been observed.

Other circuits exist having a voltage source inverter feeding a multiple LC network where clamp diodes may be connected between the network and DC voltage source. While half bridge inverter circuits are illustrated, it should be understood that full bridge and single ended inverters are also included. The LC network values and clamp point are preferably, as described herein, advantageously selected so that excessive circulating energy can be returned to the supply, preventing the build-up of excessive current and voltage, thereby protecting the components. In addition such a selection may ensure that the current always looks inductive at the source inverter, addressing diode recovery considerations. Transformers may be included in such a network to help match the output, clamp point, and inverter transistors or to provide isolation.

Further, two voltage source inverters may be connected to a network described herein so that the power level may be controlled by the phase relationship. In addition to the phase relationships described herein, non-symmetrical networks will lead to more complex phase relationships. Symmetrical networks offer the advantage that maximum and minimum power phases will not depend on frequency.

The above phase modulation circuits of the type described herein raise three potential design considerations.

First, under certain, limited conditions, DC power circulates from one bridge side to the other. When this occurs, although the FETs still see inductive turn off, when averaged over the whole cycle, the FETs are net rectifying. That is, more charge flows through the FET in a reverse rather than a forward direction. Consequently, if the current is high enough in reverse to turn on the body diode, the body diode will not be fully recovered when the transistor turns off, resulting in high power dissipation. This effect will be exaggerated by the negative temperature coefficient of the body diode voltage drop as the device heats up, potentially leading to thermal runaway.

This first consideration can be addressed at low frequencies by accepting the loss or by using reverse isolation diodes. At higher frequencies, the FETs should be selected to have sufficiently low resistance so that reverse current is always handled by the channel. This is easier to accomplish with low voltage devices because the on resistance is proportional to the voltage raised to the 2.5th power, while the diode drop is independent of voltage.

Second, a high gain condition exists when the LC networks become resonant at low phase and are not clamped until the amplitude, and thus the forward power, of the output is relatively high. This condition will not likely harm the devices, but will affect the accuracy of control.

This second consideration can be addressed by utilizing very precise and stable phase controller or modulator design or by inserting resistors in the output network which will lower the Q and broaden the phase characteristic. Utilizing resistors that require just 1 or 2% of the 50 ohm power appears sufficient. This consideration only appears when there is no real power consumed at the load, such as may occur during the slightly artificial conditions of the load being purely reactive. Generally a plasma chamber, cable, and matching network will lower the Q sufficiently Third, the phase to power control characteristic may exhibit inflections or variations under various poor match conditions. For example, as the phase varies smoothly from zero to a maximum, the power increases from zero, decreases slightly, then continues to increase. This may cause oscillation in conjunction with the non-linear plasma impedance/power function.

This consideration is theoretical in its nature and may not be a practical consideration. The control algorithm may simply jump through the inflection, which typically disappears at matches better than 3:1 voltage standing wave ratio (VSWR). Also, the power control characteristic is inflection free for at least half of an infinite VSWR circle, so the load can be placed somewhere on the VSWR circle using cable length, pie networks, and the like. In practice, the circuit of FIG. 6 is superior to FIG. 4 in that the inflections are less pronounced and occur near maximum power which typically may not be reached in practice.

The circuits described herein utilize metal oxide semiconductor field effect transistors (MOSFETs). Although, MOSFETs are generally superior to bipolar junction transistors (BJTs) or insulated gage bipolar transistors (IGBTs) at the frequencies of likely interest greater than 1 megahertz (MHz).

Figure 10:
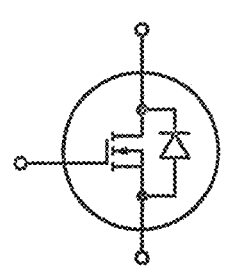
FIGS. 10-12 illustrate alternative configurations for switching devices, depending upon the particular switching device.
Figure 11:
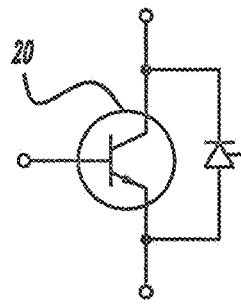
Figure 12:
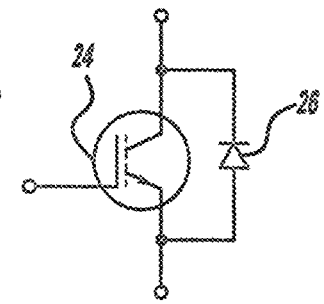

FIGS. 10-12 depict configurations for implementing switches in the circuits above using one of a MOSFET, BJT, or IGBT transistor. FIG. 10 shows a MOSFET as used in the circuits described above. The MOSFET includes a blocking diode which is inherent in the design of the MOSFET. FIG. 11, shows a BJT 20 and an anti-parallel diode 22. In the circuits described above, when implementing the switches using a BJT 20, an anti-parallel diode 22 must be included in order to provide a circuit path when the clamping diodes D1, D2 are active.

Similarly, FIG. 12 shows a preferred configuration when implementing switches disclosed herein and utilizing an IGBT. FIG. 12 shows an IGBT 24 and an anti-parallel diode 26, which provides a similar function as anti-parallel diode 22 of FIG. 11. It should be noted that other switching devices or circuit combination providing a suitable switching and circuit path functions may also be used in the place of MOSFETs.

Figure 13:
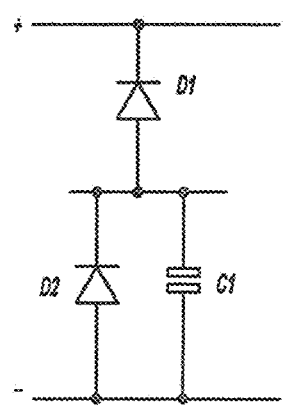
FIG. 13 illustrates a circuit having a capacitor in parallel with one of the clamping diodes.
Figure 14:
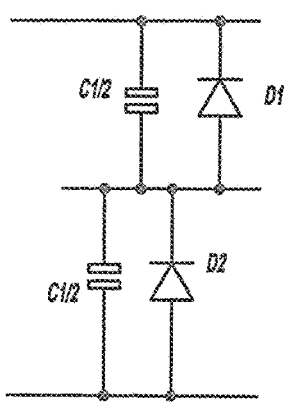
FIG. 14 illustrates a circuit having a capacitor in parallel with each of the clamping diodes.
Figure 15:
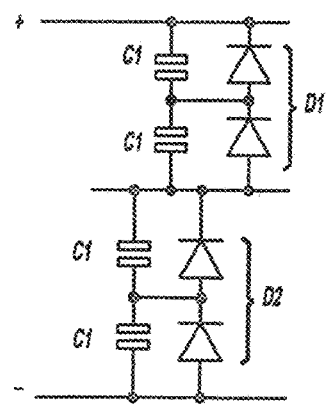
FIG. 15 illustrates a circuit having a voltage divided across a series of capacitors and diodes.

FIGS. 13-15 depict alternative diode clamping circuits described with respect to D1, D2. FIG. 13 depicts a diode clamping circuit including diodes D1, D2 and capacitor C1. This circuit has been described above. FIGS. 14 and 15 show implementations using alternate configurations of the diodes D1, D2 and capacitor C1. In each circuit, capacitor C1 may be implemented utilizing two identical capacitors of half the value placed across each diode, as shown in FIG. 14. Capacitors C1/2 are effectively in parallel, coupled through decoupling capacitor C3 (not shown in FIG. 14). Decoupling capacitor C3 is made large relative to the operating frequency so its impedance is negligible, thereby assisting the circuit physical layout and component power sharing.

As shown in FIG. 15, at higher frequencies it may be advantageous to use two diodes in series for each diode D1, D2. Generally lower voltage diodes have lower reverse recovery charge. With two diodes in series, the same charge flows through each diode. Dividing C1 up across each diode ensures equal sharing of the AC voltage.

Figure 16:
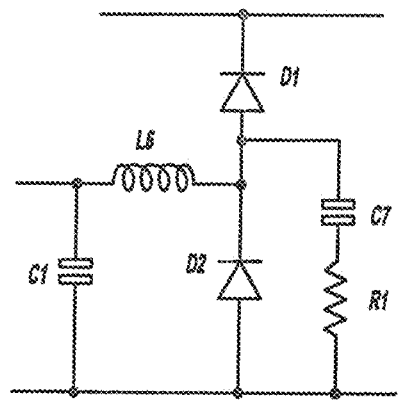
FIG. 16 illustrates a circuit showing an inductance and RC circuit in the protection circuit.

As shown in FIG. 16, in a further variation of the clamping circuit, inductor L6 is placed in series with L1 and between the junction of the clamp diodes D1, D2 and filter capacitor C1. Inductor L6 is preferably of a small value. This can soften the diode turn on and off, increasing the efficiency of rectification. A snubber circuit formed by capacitor C7 and resistor R1 may be required to dampen high frequency ringing when diodes D1, D2 turn off. Correctly chosen, this will also contribute to reducing high Q situations if the LC network becomes resonant at low power output, such as where there is a low phase angle between the two parallel bridge circuits.

As discussed above, power control precision can be compromised as a result of a high gain condition existing if the LC filter networks become resonant at low phase and are not clamped until the amplitude, and thus the forward power, of the phase is increased. This can be addressed by a very precise and stable phase modulator design or by resistors connected in the output network and having a value sufficient to reduce the Q and broaden the phase characteristic. Consuming approximately 1-2% of the 50 ohm power appears sufficient to address this consideration. This typically only occurs where low power is consumed at the load, such as under the somewhat artificial condition of pure reactive loads in test conditions. In practice, cable, matching networks, and the load will sufficiently lower the Q. At larger phase shifts the clamping diodes prevent the resonance.

Figure 17:
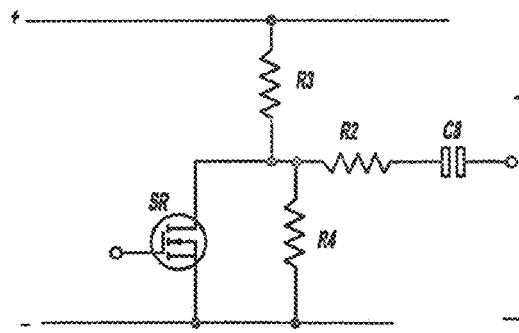
FIG. 17 illustrates a MOSFET circuit for improving operation of the filter network.

Alternatively, the Q may be selectively lowered by switching in resistors at the clamp point only when the phase is low. This may be achieved using a comparator on the phase modulator demand, set to come on for low values. This can then drive a relay, which may take the form of a MOSFET switch which is actuated when the phase difference is relatively low, such as in low power demand. FIG. 17 shows a circuit for selectively inserting resistors at the clamp point. As shown in FIG. 17, a MOSFET SR can be advantageously used because the voltage swing is limited by the clamp diodes and because a MOSFET will conduct in both directions. Bias resistors R3, R4 can center the voltage swing within the range of SR. R2 is chosen to provide sufficient damping, and C8 blocks DC from flowing through R2 and through the MOSFET SR. The input to SR typically is provided through a control circuit. The output from C8 is connected to the interconnection of diodes D1, D2.

Figure 18:
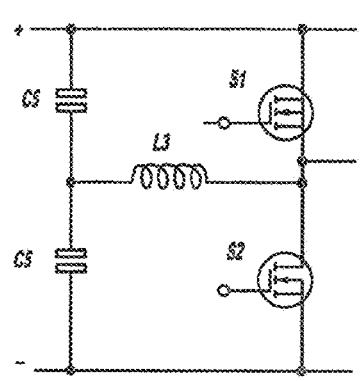
FIG. 18 illustrates a circuit for an alternative input circuit for an inverter for addressing device capacitance.

As the operating frequency is increased the capacitance of FETs typically implementing the switches has a more significant effect on circuit operation. FIG. 18 shows an enhancement to a half bridge circuit.

In FIG. 18, capacitors C5 have been placed in parallel with capacitor C3 (not shown). An inductor L3 is inserted between the inter connection between capacitors C5 and the output of switches S1, S2. Inductor L3 ensures that sufficient inductive current always flows to charge and discharge the output and Miller capacitance of FETs S1, S2. Inductor L3 also ensures that the current appears inductive if the output and clamp network allows capacitive load current to flow.

As discussed above, DC power may circulate from one bridge side to the other under certain conditions. As a result, while the FETs S1, S2 still see inductive turn off, when averaged over a whole cycle, the FETs S1, S2 are net rectifying. That is, more charge flows in a reverse rather than a forward direction. Consequently, if the current is high enough to reverse and turn on the body diode contained within the FET, the FET switch will not be fully recovered when the transistor of the FET turns off, and high power dissipation will result. This will be exaggerated by the negative temperature coefficient of the body diode voltage drop as the FET device heats up, potentially leading to thermal run away.

As also discussed above, at low frequencies this condition can be addressed by accepting the loss, or using reverse isolation diodes. At higher frequencies the FETs should be selected to have sufficiently low enough on resistance so that the reverse current is always handled by the FET channel. This is easier to accomplish with low voltage devices because the on resistance is proportional to the voltage raised to the 2.5th power while diode drop is independent of voltage.

Figure 19:
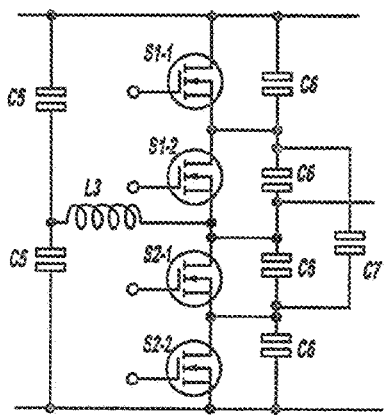
FIG. 19 illustrates an inverter circuit for addressing device capacitance implemented using multiple FETs.

As shown in FIG. 19, two lower voltage FETs S1-1, S1-2 and S2-1, S2-2 may be connected in series. These FETs will typically have one quarter of the on resistance compared to two FET devices in parallel and will drop half the voltage through each. Thus, the threshold current for diode construction will double. In FIG. 19, capacitors C6 may be placed in parallel with each switch S1-1, S1-2, S2-1, S2-2. Capacitors C6 may be required to ensure equal voltage sharing, but also add to the effective device capacitance. A capacitor C7 further promotes equal voltage sharing and only passes imbalance currents. In this configuration, fast recovery epitaxial diode (FREDFET) switches may offer advantages due to their reduced reverse recovery charge.

Figure 20:
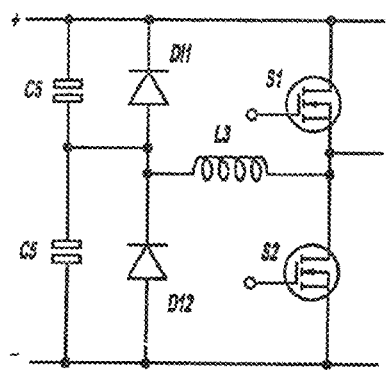
FIG. 20 illustrates an improvement to the input circuit of FIG. 18.

FIG. 20 shows yet another improvement to the circuit of FIG. 18. Two clamp diodes DI1, DI2 are inserted in parallel with each of capacitors C5. Diodes DI1, DI2 are selected to rectify current or voltage at the junction for return to the supply. This cycles inductive current as in FIG. 18 to commutate the capacitance of the FETs S1, S2 and also absorbs DC from the FETs S1, S2 and returns the DC to the supply rails. This can also handle any DC flowing from one bridge side to the other and thus also address FET body diode recovery considerations. Capacitors C5 and diodes DI1, DI2 may be configured in series and parallel combinations similarly to the main clamping arrangement, but typically require lower power handling capability. If a variable frequency of operation is desired the circuit FIG. 20 offers the additional advantage that the turn-off current remains approximately the same, independent of frequency, so long as L3 and C5 have been chosen so that diodes DI1, DI2 are always conducting.

Figure 21:
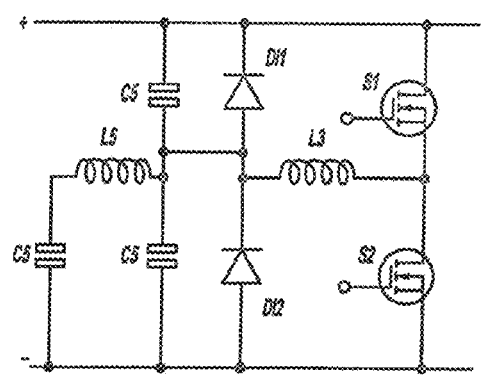
FIG. 21 illustrates an inverter having an additional LC series circuit.

An improvement to the circuit of FIG. 20 is shown in FIG. 21, which includes an additional LC series circuit including inductor LS and capacitor CS. By properly selecting the values of inductor LS and capacitor C5 so that the resonant frequency is between the primary frequency of the power supply and its third harmonic, the current through inductor L3 increases with frequency and maintains the DC current approximately constant.

Although negative and positive rails provide convenient reference voltages for clamping a predetermined point which is responsive to mismatch effects and also allows feeding back of the voltage and/or current to the inverter, it is also possible to connect the clamping diodes across some other, predetermined voltage source so that clamping occurs. Because the circuit must sometimes dissipate excess voltage and current, referencing an alternate voltage source preferably include referencing constant voltage sink.

Figure 22:
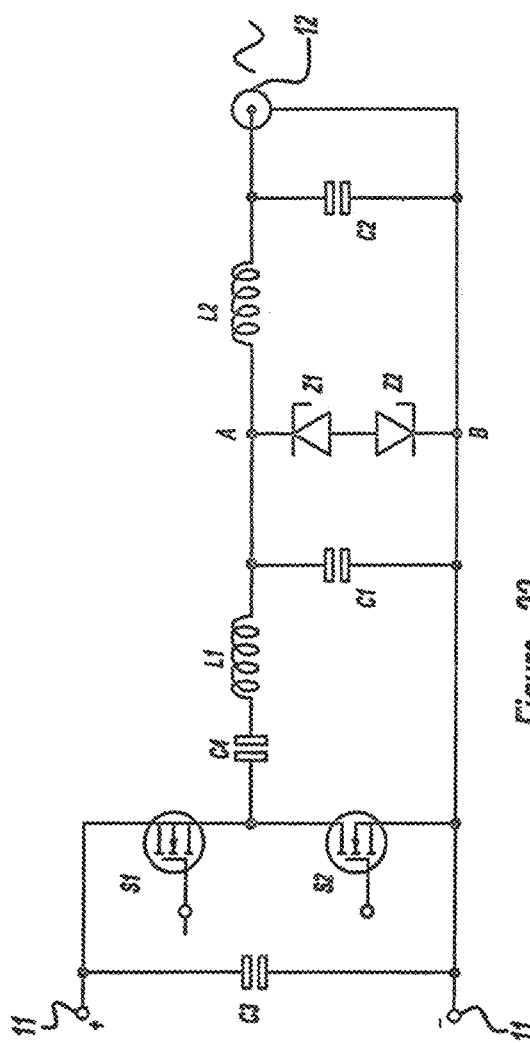
FIG. 22 illustrates a power supply circuit for varying the clamping voltage.

FIG. 22 illustrates a circuit referencing voltages other than the negative and positive voltage rails. A blocking capacitor C4 is inserted between the inductor L1 and the inverter switches S1, S2 so that Zener diodes Z1, Z2 set respective high and low voltage references for clamping. Zener diodes Z1, Z2 connect back to back in series between points A and B so that one will conduct and dissipate energy by heating if the voltage at point X is driven positive, and the other will conduct and dissipate energy if the voltage at point X is driven negative. One diode operates in a rectifier mode when the other device in a Zener mode.

Figure 23:
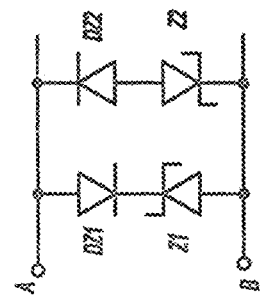
FIGS. 23-26 illustrate alternative constant voltage sink arrangements for use with the inverter of FIG. 22.

In practice the Zener diodes Z1, Z2 do not switch well at high speed. This condition may be compensated for by substituting the configuration of FIG. 23 for Zener diodes D1, D2. FIG. 23 includes Zener diodes Z1, Z2 each placed back to back in series with respective conventional diodes DZ1, DZ2. The Zener/conventional diode series connections are then placed in parallel. In this configuration, Zeners diodes Z1, Z2 need not operate in a rectifying mode.

Figure 24:
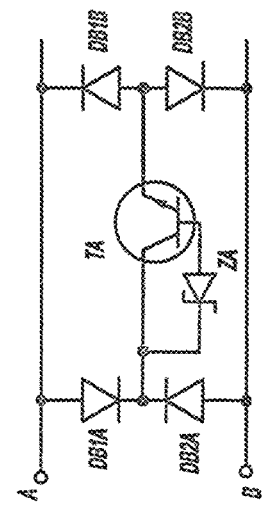

A further consideration is that Zener diodes are not currently available in particularly high power ratings. Presently the maximum power rating for a Zener diode is approximately 70 W. Further, Zener diodes which do have a relatively high power rating are typically expensive. Transistors, however, are relatively inexpensive and readily available in very high power ratings. One way to overcome the limitations of Zeners is to use an active Zener circuit such as shown in FIG. 24. In FIG. 24, the Zener diode ZA primarily functions to turn on a transistor TA which is configured for dissipating higher power levels, approximately 100 times that of Zener diode ZA. The power dissipation in transistor TA is a function of the gain of the active Zener circuit.

With reference to FIG. 24, when diode ZA is in a Zener mode, the following equations apply:

$$V = V_2 + V_{BE}, \text{ where } V_{BE} \gg 0.6v$$

$$I = I_2 + I_Q, \text{ where } I_Q \gg HFE \cdot I_2 \text{ and } HFE \gg 100$$

so that $$I_Q \gg I_2,$$

, and $$P_Q \gg P_2.$$

As can be seen from the equations above, the current through transistor TA is much greater than the current through Zener diode ZA, and the power dissipated by transistor TA is much greater than the power dissipated by the Zener diode ZA.

Figure 25:
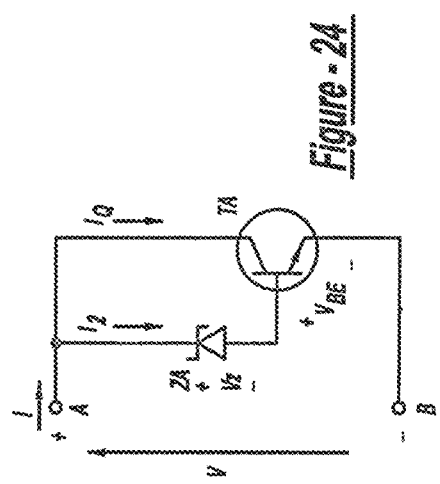
Figure 26:
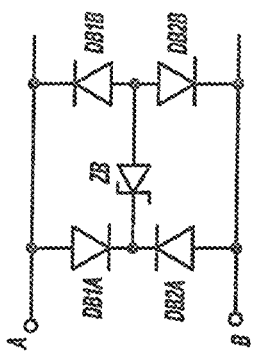
Figure 23:
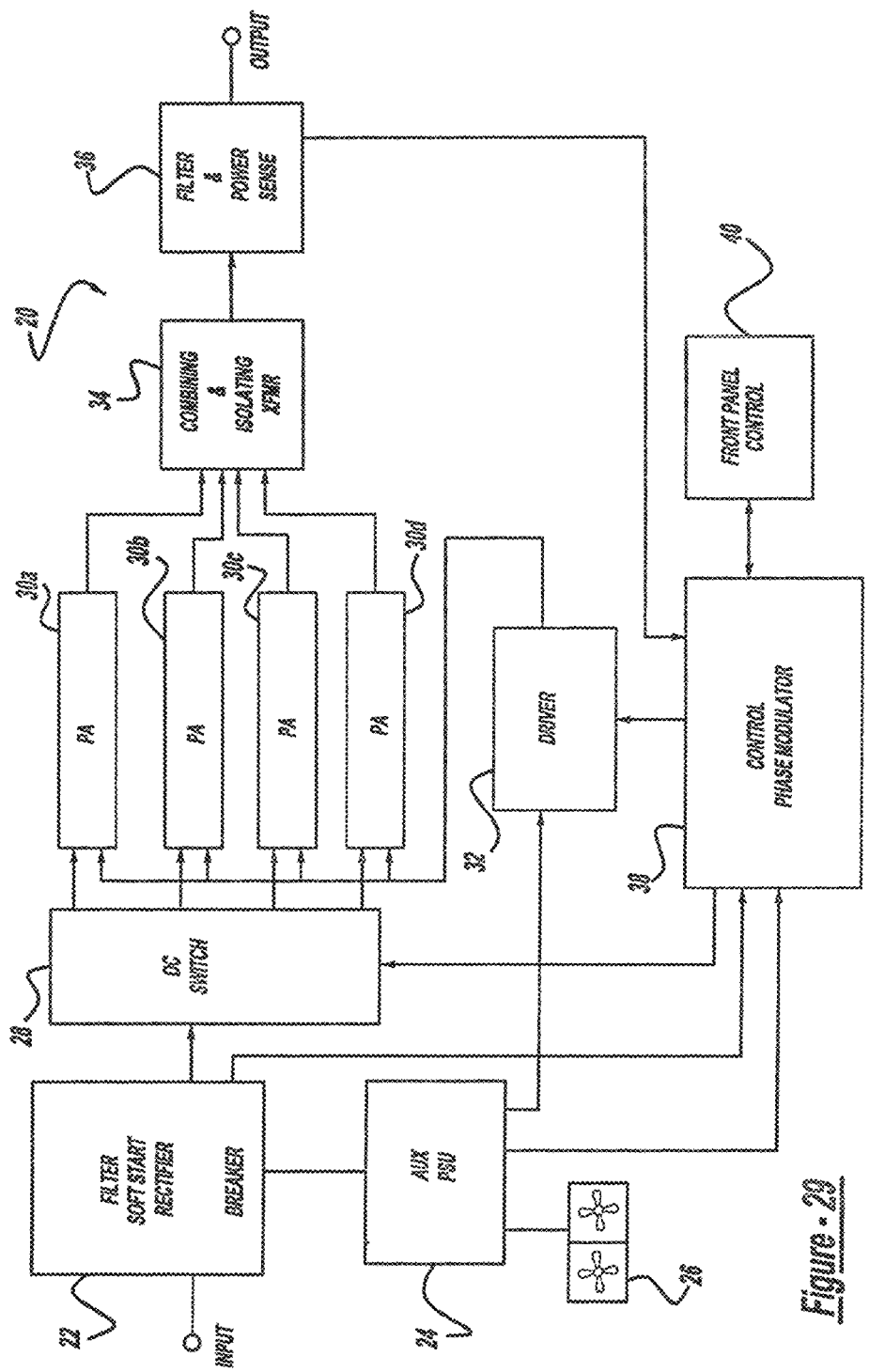

FIG. 25 depicts an alternate arrangement for setting a voltage reference other than the negative and positive rails of the inverter. In particular, FIG. 25 shows a diode bridge comprising diodes DB1A, DB2A, DB1B, DB2B. A Zener ZB is connected across the halves of the diode bridge. Accordingly, whether for a negative wave or positive wave, Zener diode ZB enters Zener mode when the voltage exceeds the threshold voltage. FIG. 26 depicts a diode bridge arrangement similar to FIG. 25, but includes a transistor TA and Zener diode ZA arrangement similar to FIG. 24, thereby providing increased power dissipation.

The diode bridge circuits of FIGS. 24-26 provide several advantages. First, the design reduces cost because only one Zener diode must be used, rather than two. Second, because only one Zener diode is used, consistent clamping voltages may be obtained, rather than possibly inconsistent clamping voltages obtained using a two Zener diode arrangement. Third, conventional diodes are much more easily matched than the Zener diodes.

FIG. 27 shows waveforms measured for an exemplary circuit implementation of a power supply having a protection circuit. Operating waveforms and power levels were recorded for 300V DC input under matched and mismatched conditions. The load impedances matched at 50 ohms and mismatched using open circuit, short-circuit, and 12, 25, 50, 100 and 200 ohms both inductive and capacitive reactive. With reference to FIGS. 27A-27M, each figure includes four waveforms, labeled 1-4 in each figure. Waveform 1 indicates the drain voltage of the MOSFETs, such as the output input of inductor L1, at 200 volts per division. Waveform 2 indicates the current through L1, at 10 amps per division. Waveform 3 is the clamp voltage or voltage at the node between diodes D1, D2, at approximately 200 volts per division. Waveform 4 is the clamping diode current, at 10 amps per division. These conventions apply to each of the output waveforms of FIGS. 27 and 28. The selected values provide 12 discreet points at infinite VSWR sufficient to ensure worst operating conditions are found. The table below lists the key parameters:

|  | Load | DC Current (Amps) | RF Forward Power (Watts) | Power Dissipation (Watts) | Peak FET Current (Amps) | Diode Current (Amps) |
|---|---|---|---|---|---|---|
|  | 50 ohms | 1.71 | 465 | 48 | 10 | 4 |
|  | Open Ckt. | 0.109 | 138 | 33 | 10 | 0 |
| Inductive | 200 ohm | 0.139 | 145 | 42 | 12 | 0 |
|  | 100 | 0.162 | 157 | 49 | 13 | 0 |
|  | 50 | 0.226 | 176 | 68 | 14 | 10 |
|  | 25 | 0.240 | 155 | 72 | 14 | 18 |
|  | 12 | 0.242 | 149 | 73 | 13 | 23 |
|  | Short Ckt. | 0.204 | 202 | 61 | 10 | 24 |
| Capacitive | 12 ohm | 0.184 | 231 | 55 | 9 | 23 |
|  | 25 | 0.173 | 342 | 52 | 7 | 23 |
|  | 50 | 0.071 | 300 | 22 | 4 | 0 |
|  | 100 | 0.073 | 190 | 22 | 7 | 0 |
|  | 200 | 0.088 | 150 | 26 | 9 | 0 |

As the load rotates from open circuit to short circuit inductively, then back again capacitively, the FET currents are maintained inductive and are less than 40% higher than the 50 ohm value. DC current consumption is only a one-sixth of the 50 ohm value. The clamping diodes D1, D2 can be seen to conduct slightly with a 50 ohm load, which could be eliminated by slightly retuning the network. This, however, is not critical to efficiency or effective protection.

By way of contrast, FIG. 28 depicts output waveforms for a 375 KHz half bridge inverter implemented without the clamp circuit. During the testing, the test device was protected to avoid device destruction by manually reducing the supply voltage. The table below lists the key parameters. Protection now is accomplished by reducing the supply voltage.

|  | Load | DC Current (Amps) | RF Forward Power (Watts) | Power Dissipation (Watts) | Peak FET Current (Amps) |
|---|---|---|---|---|---|
|  | 50 ohms | 1.86 | 514 | 44 | 10 |
| Inductive | 50 ohm | 0.25 | 241 | 75 | 15 |
|  | 25 | 0.41 | 424 | 124 | 18 |
|  | 12 | 0.36 @ 200 V | 331 | 73 | 14 |
|  | Short Ckt. | 2.15 @ 42 V | 752 | 90 | 14 |
| Capacitive | 12 ohm | 0.46 @ 40 V | 53 | 23 | 2.0 |
|  | 25 | 0.12 @ 50 V | 21 | 6 | 0.5 |

As the inductive load impedance is reduced, the FET currents become larger. If at 12 ohms the supply was maintained at 300V, forward power would have reached 750 W, more than the 50 ohm value. At short circuit, 750 W is produced from only 42V, with L1 resonant with the rest of the network. At 300V, forward RF power would be some 38 KW, DC power 4.6 KW and the peak transistor current 100 A.

As the load swings capacitive and the impedance starts to rise, the FETs see a capacitive load. This condition can be more problematic than the high inductive currents seen before resonance because the FETs will suffer high diode recovery loss even though the currents are still modest. Further there also is a risk of commutating dv/dt failure. Note in the last three graphs the scales have been changed for clarity.

FIG. 29 depicts a control circuit for a power generator. Control circuit 20 includes a filter soft start rectifier 22 which receives an input voltage. Rectifier 22 may include a circuit breaker for overvoltage protection. An auxiliary power sense unit (PSU) 24 generates a lower voltage signal for powering control circuitry. A cooling fan 26 provides cooling to the generator circuit.

The output from the filter soft start rectifier 22 is applied to an optional DC switch 28 which controls the application of the DC voltage to a plurality of power amplifiers 30a, 30b, 30c, 30d. Four powers amplifiers 30a-30d are used in parallel in order to divide power handling across four amplifiers, rather than requiring one amplifier to handle the entirety of the power. Alternatively, one or many power amplifiers may carry out the function of power amplifiers 30a-30d. A driver circuit 32 generates switching signals to control the switching of each of the respective power amplifiers 30a-30d.

The output from power amplifiers 30a-30d is input to combining and isolating transformer 34 which combines each of the outputs from power amplifiers 30a-30d into one signal. Combining circuit 34 may include an isolation transformer to isolate the power amplifiers from the output. Combining isolation transformer 34 outputs the combined signal to a filter and power sense circuit 36 which filters the power signal prior to generating the output. The power sense portion of the circuit 36 provides a feedback signal to control phase modulator protection circuit 38.

Control phase modulator circuit 38 may be implemented using analog or digital electronics. The circuit 38 outputs a control signal to each of DC switch 28, driver 32, and front panel control 40. By varying the phase of switching of within each of the respective power amplifiers 30a-30d, the output power may be correspondingly varied. Accordingly, control phase modulator circuit 38 varies the phase of the power amplifier in accordance with input from the filter and power sense circuit 36. Front panel control circuit 40 provides information to the operator and also enables for variation of the desired phase and consequent output power.

Figure 30:
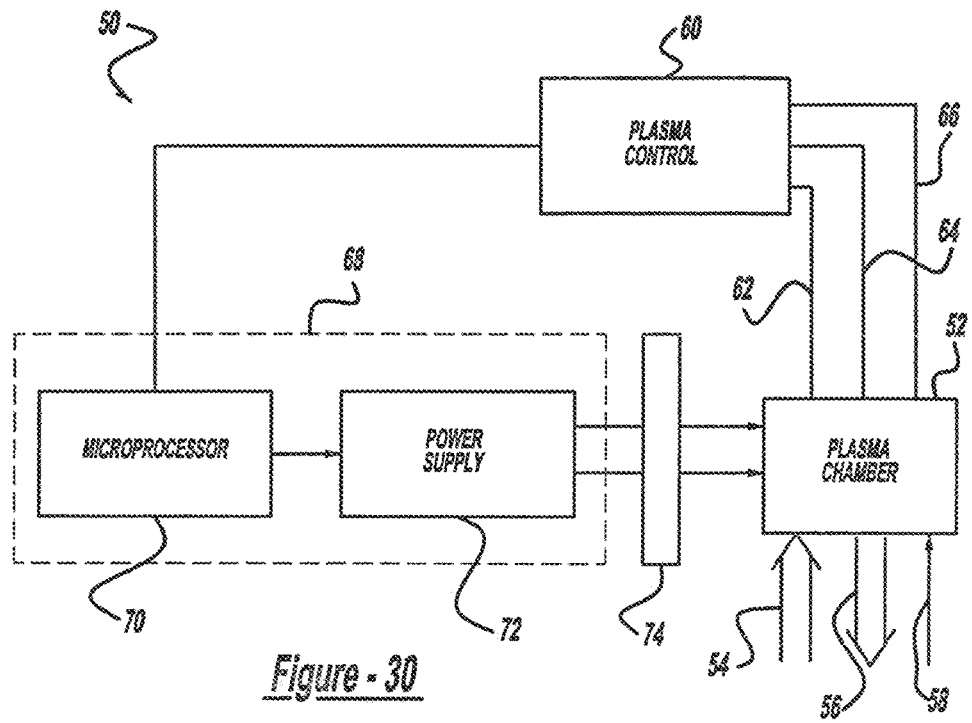
FIG. 30 is a block diagram for a plasma system utilizing a protection circuit.

FIG. 30 depicts a control system where selected power supplies described herein may be used in a system for controlling a plasma chamber. Control system 50 includes a plasma chamber 52, such as may be used for fabricating integrated circuits. Plasma chamber 52 includes one or a plurality of gas inlets 54 and one or a plurality of gas outlets 56. Gas inlets 54 and outlets 56 enable the introduction and evacuation of gas from the interior of plasma chamber 52. The temperature within plasma chamber 52 may be controlled through a heat control signal 58 applied to plasma chamber 52. A plasma controller 60 receives inputs from the plasma chamber including a vacuum signal 62 which indicates the level of vacuum in the chamber, a voltage signal 64, and a signal 66 indicating the ratio of flows between the inlet and outlet gases. As one skilled in the art will recognize, other inputs/outputs may also be received/generated by plasma controller 60. Plasma controller 60 determines a desired input power to be applied to plasma chamber through a voltage generator 68. Voltage generator 68 includes a microprocessor 70, or other similar controller, which receives the input signal from plasma controller 60. Microprocessor 70 generates control signals to power supply 72 which outputs a voltage signal at a desired frequency and power rating. The voltage output from power supply 72 is input to a matching network 74 which matches impedances between power supply 72 and plasma chamber 52.

Figure 31:
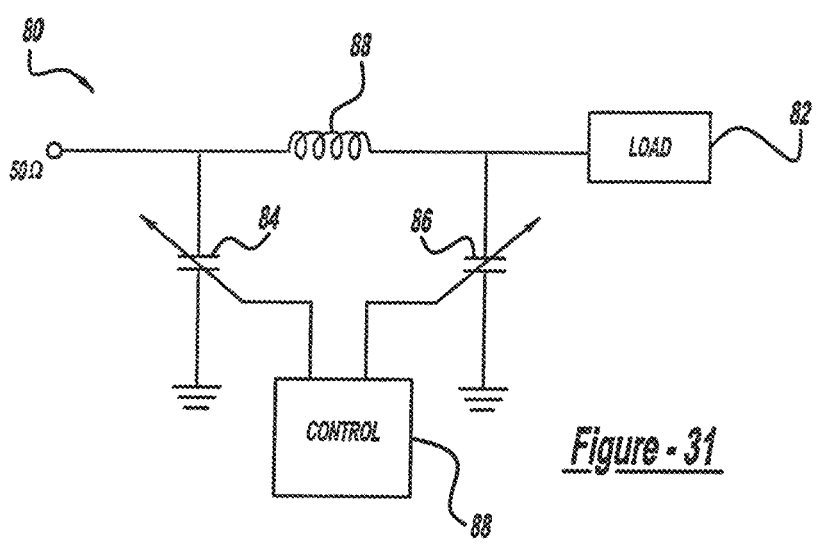
FIG. 31 illustrates a matching network for the control circuit of FIG. 30.

FIG. 31 depicts a circuit for a matching network 80, such as may be implemented for matching network 70 of FIG. 30. Matching network 80 desirably matches a 50 ohm input impedance with the output impedance supplied by a load 82. Matching network 80 is configured in a pi filter topology, including a first variable capacitor 84, a second variable capacitor 86, and an inductor 88. Capacitors 84, 86 are implemented as variable capacitors, so that the capacitance of the filter network may be varied in order to properly match impedances between the 50 ohm input and the load 82. A controller 88 receives a feedback signal which varies in accordance with the impedance matched and generates control signals which vary the capacitances of respective capacitors 84, 86. One skilled in the art that will recognize other matching network configurations may also be implemented, such as transformers or fixed networks.

Figure 32:
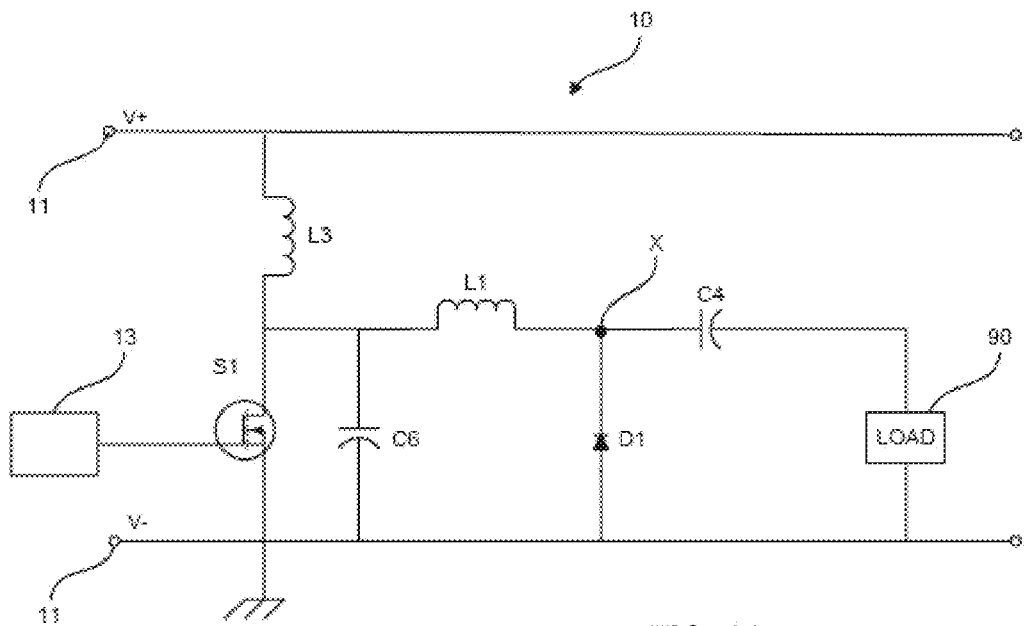
FIG. 32 illustrates a circuit showing a single-ended amplifier.

With reference to FIG. 32, FIG. 32 depicts a single-ended, and more particularly a class E amplifier. It should be noted that like reference numerals used in the specification will refer to components which perform similar operations. FIG. 32 depicts a switch or transistor S1 arranged in series with an inductor L3 between a pair of voltage rails V+ and V− of a DC power source 11. Switch S1 receives control signals from a signal source or generator 13. Switch S1 is arranged in parallel with a capacitor C6 which forms a parallel-resonant circuit with inductor L3. In combination, switch S1, inductor L3, and capacitor C6 cooperate to form a single-ended amplifier. At the output of the amplifier, inductor L1 and clamping diode D1 cooperate to form an inductive clamp circuit. The inductive clamp circuit is interposed between the output of switch S1 and a load 90 and operates similarly as described above with respect to FIGS. 1-31. Inductor L1 and capacitor C4 coordinate to form a harmonic filter at the output of switch S1 and provide a filtered signal to load 90.

Clamping diode D1 is interposed between the negative rail V− and node X. The anode of clamping diode D1 is connected to the negative voltage rail V−, and the cathode of clamping diode D1 is connected to node X. When the circuit of FIG. 32 attempts to drive node X beyond a predetermined threshold, diode D1 is turned on, thereby clamping the voltage at node X to a predetermined value, typically 2V volts, where V is the rail voltage.

In one configuration, the values of capacitor C6, inductor L1, and capacitor C4 are selected so that diode D1 does not conduct when the load is properly matched. The selection of such values reduces the generation of undesirable harmonics. In an alternate configuration, however, if the presence of harmonics is considered acceptable, the values may be selected so that diode D1 conducts even if the load is matched.

Diode D1 of FIG. 32 introduces some parasitic capacitance between the junction of inductor L1 and capacitor C4 and ground. If this capacitance becomes excessive, power delivery to load 90 may be compromised. With a slight modification to the circuit of FIG. 32, however, the parasitic capacitance of clamping diode D1 can be used advantageously.

Figure 33:
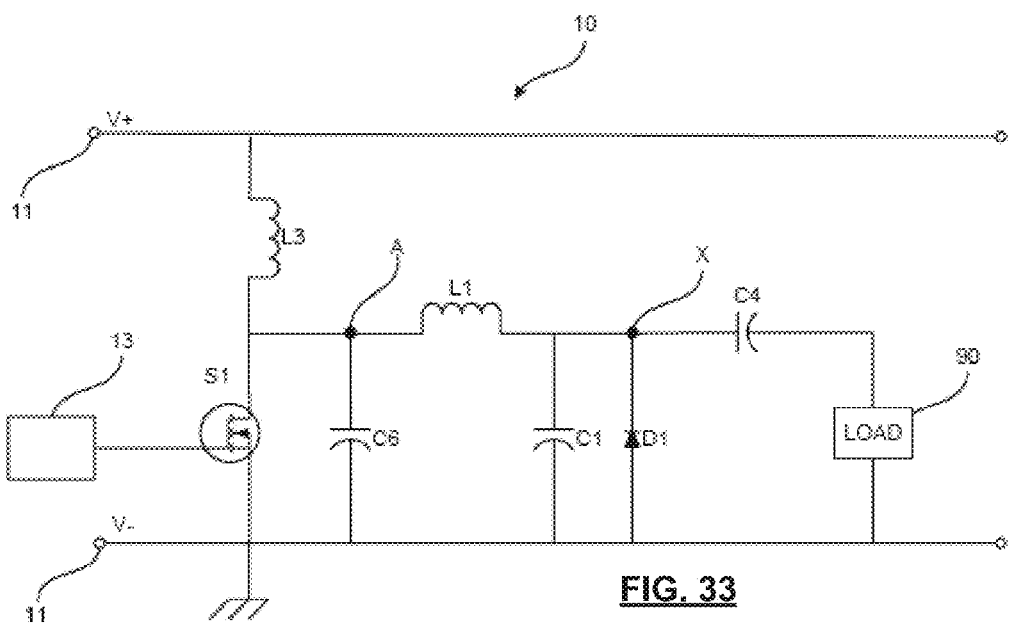
FIG. 33 illustrates a circuit showing a second configuration for a single-ended amplifier arranged.

With reference to FIG. 33, capacitor C1 is placed in parallel with diode D1, and the function of capacitor C4 is varied slightly. With this modification, capacitor C1 of FIG. 33 performs the function of capacitor C4 of FIG. 32. Capacitor C4 of FIG. 33 now provides a DC blocking capacitance and, consequently, should have a relatively high capacitance value. The circuit of FIG. 33 offers the additional benefit that the resonant frequency of inductor L1 and capacitor C1 can be the amplifier operating frequency. In this configuration, inductor L1 and capacitor C1 cooperate to form a harmonic filter at the output of switch S1. As described with respect to FIG. 32, the clamping diode D1 of FIG. 33 interconnects between the negative voltage rail V− and node X. When the circuit of FIG. 33 attempts to drive node X below a predetermined threshold, diode D1 turns on, thereby clamping the voltage at node X to a predetermined value, typically 2V volts.

Figure 34:
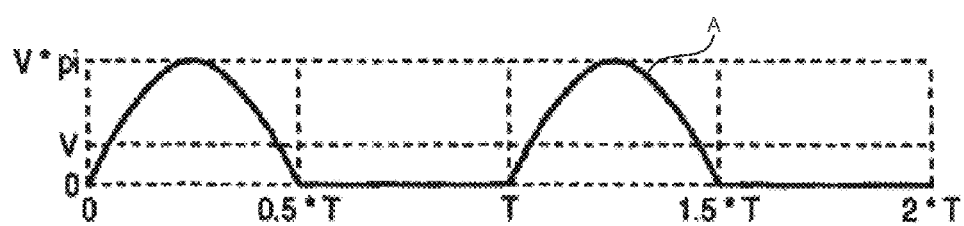
FIG. 34-36 illustrate waveforms describing the operation of the circuit of FIG. 33.
Figure 35:
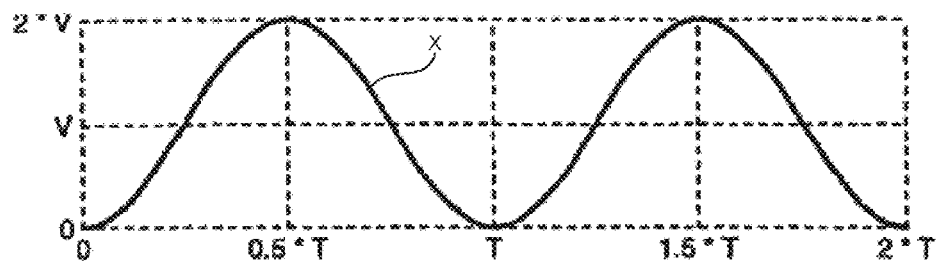
Figure 36:
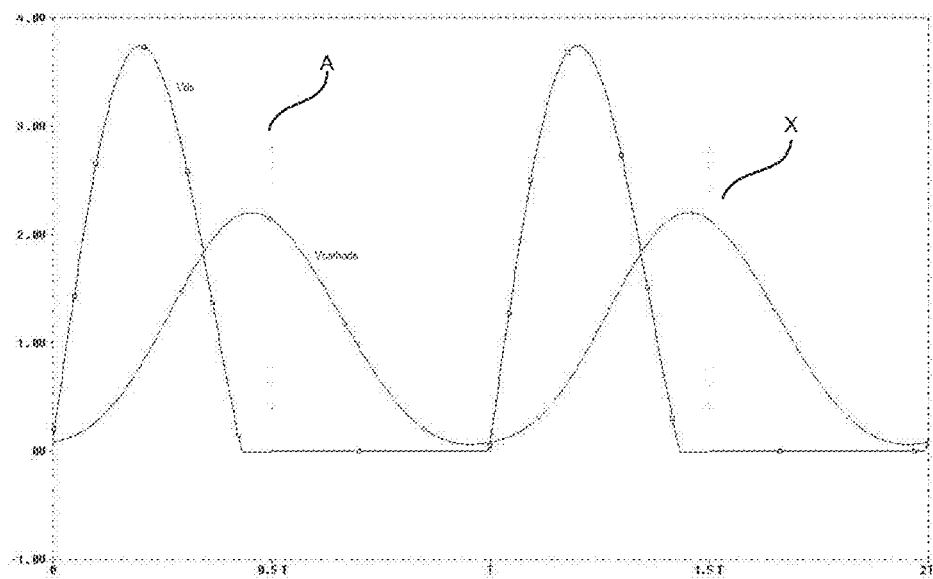

FIGS. 34-36 depict waveforms describing the operation of the circuit of FIG. 33. FIG. 34 depicts the expected waveform at node A of FIG. 33, and FIG. 35 depicts the expected waveform at node X of FIG. 33. As can be seen, the expected waveform at node A is a half-wave rectified sine wave. If the DC current through inductor L3 is constant, the peak voltage at node A will be $\pi$ times the DC rail voltage ($\pi$V). Preferably, the values of inductor L1 and capacitor C1 are chosen so that the voltage at the cathode of diode D1 (node X) approaches ground when the load is matched. Because the fundamental component of the voltage waveform at node A is $\pi \times V/2$, the characteristic impedance of inductor L1 and capacitor C2 is $\pi/2$ times the matched load impedance. This relationship is depicted in the waveforms of FIGS. 34 and 35. In operation, a substantial second (even) harmonic component is embedded in the waveform appearing at node A. Some of this second harmonic component is passed onto the waveform at node X. FIG. 36 depicts waveforms representative of the voltage at nodes A and X as determined by a simulation.

Figure 37:
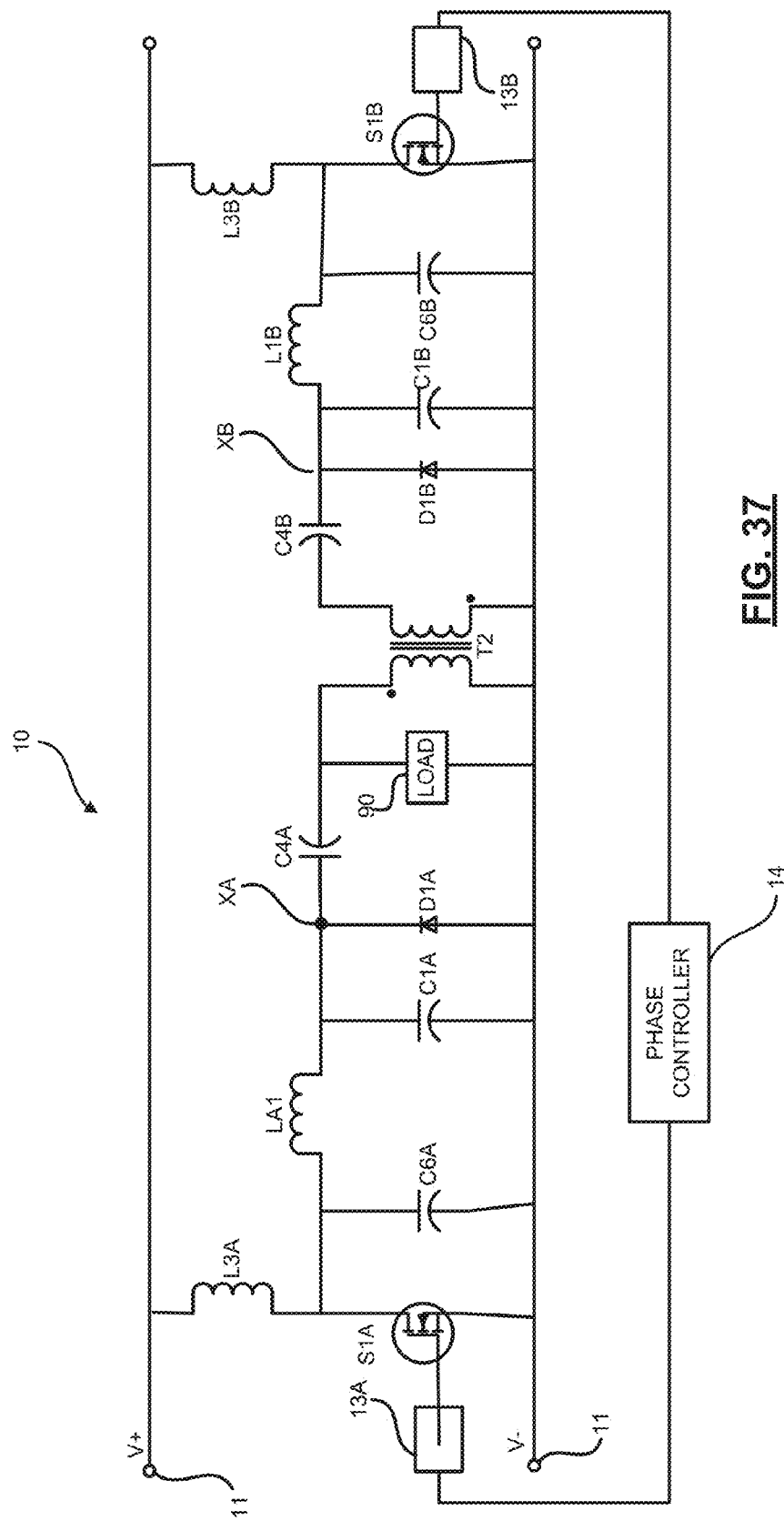
FIG. 37 illustrates a circuit depicting a pair of single-ended amplifiers arranged in a push-pull configuration.

FIG. 37 depicts a configuration for addressing the even harmonics, as discussed with respect to the simulation waveform of FIG. 36, output by the class E amplifier. In particular, FIG. 37 depicts a pair of class E amplifiers, as depicted of FIG. 33, arranged in a push-pull configuration. It should be again noted that like reference numerals refer to similar components and such reference numerals may include additional suffix designators, such as A or B, to refer to components associated with respective halves of the parallel configuration.

FIG. 37 depicts a circuit having circuit halves A, B which are combined in parallel to provide an AC signal to load 90. Each circuit half A and B generally includes a class E amplifier configuration as described above with respect to FIG. 34. A transformer T2 joins each circuit half at the output of capacitor C4 in order to combine the output from each half A and B for application to the load 90. Switches S1A and S1B are driven 180 degrees out phase from each other in accordance with signals output by phase controller 14 to signal generators 13A, 13B. The output from respective capacitors C4A and C4B is joined via a transformer T2. Preferably, transformer T2 enables maximum coupling of each circuit half. Such maximum coupling enables control of the peak voltages at the respective cathodes (negative terminals) of diodes D1A and D1B, so that the voltage at each is clamped to two times the DC rail voltage.

Preferably, the coupling provided by transformer T2 insures balanced loading of both circuit halves and, consequently, both amplifiers. The matched load 90 of FIG. 37 is typically one-half the impedance of the matched impedance for just one of the two amplifiers. Designers typically prefer a higher output impedance rather than a lower output impedance. An optional balun may be added to the circuit of FIG. 37 to increase the matched load impedance by a factor of 4.

Figure 38:
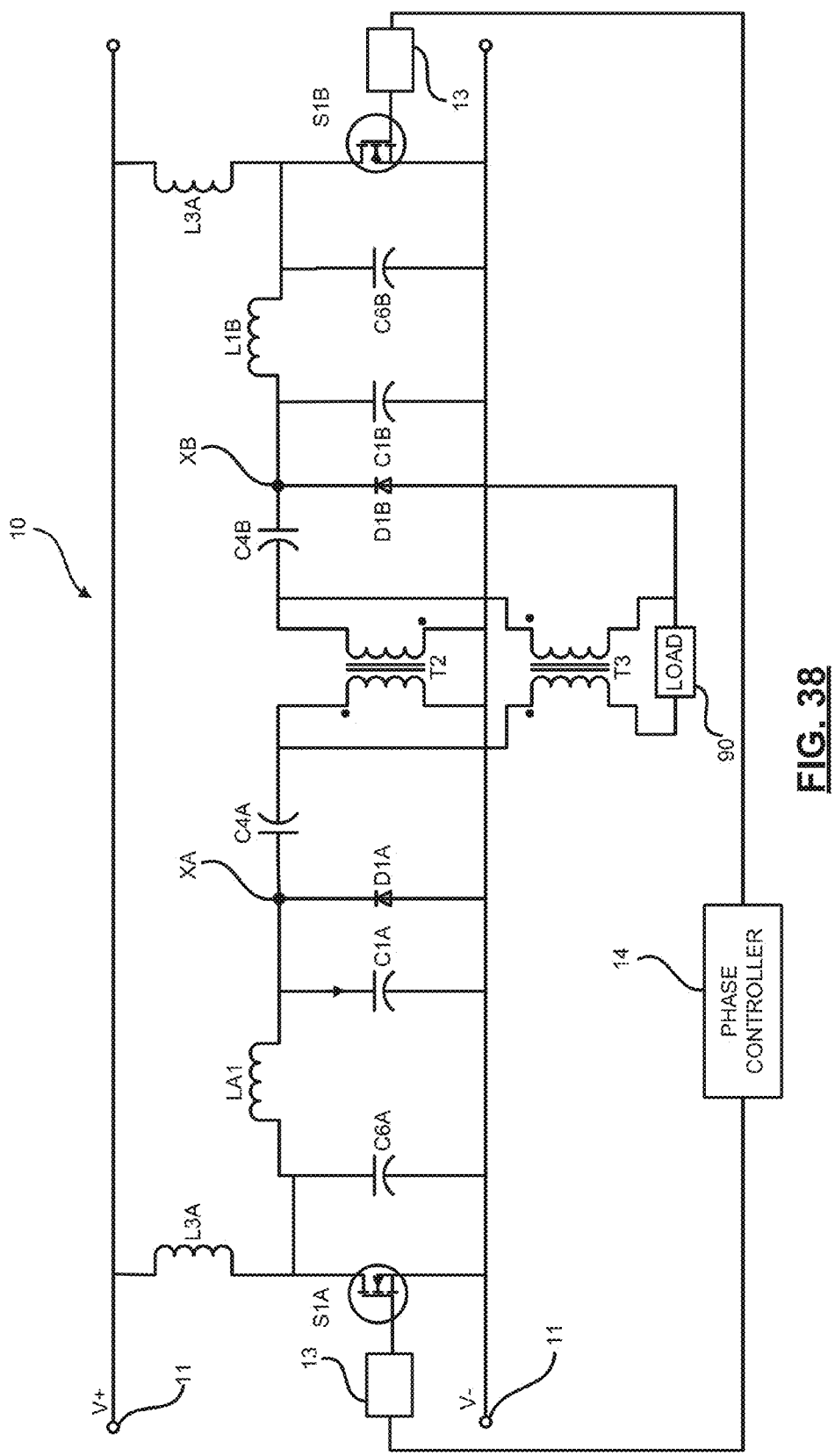
FIG. 38 illustrates a circuit depicting a pair of single-ended amplifiers arranged in a push-pull configuration and including an additional circuit for balancing the load.

FIG. 38 depicts a modification to FIG. 37 to provide a higher output impedance. With reference to FIG. 38, FIG. 38 is arranged similarly to FIG. 37 with the addition of a transformer T3 arranged at the output of each respective circuit half. Accordingly, the transformer T2 of FIG. 38 has applied to it magnetizing current, even harmonic current, and diode current. Transformer T2 of FIG. 38 does not receive any load current. Accordingly, transformer T2 of FIG. 38 may be packaged considerably smaller than transformer T2 of FIG. 37. Further, the circuit of FIG. 38 can operate without transformer T2, but transformer T2 minimizes peak voltages across diodes D1A and D1B.

Designers typically select a class E amplifier configuration when frequency or phase modulation is used to send data. Amplitude modulation, on the other hand, presents certain challenges for a class E amplifier because the amplifier input must remain constant. One manner for implementing amplitude modulation, and output power control, is to vary the DC rail voltage. While varying the DC rail voltage proves effective with any amplifier, the inductive clamps described herein enable implementation of another control method.

An amplifier incorporating the inductive clamp as described herein can operate with virtually any load without damage to the switches. Accordingly, it is possible to combine two or more of these amplifiers in either a parallel and/or series push-pull configuration. Output power may then be controlled by varying the phase difference between the amplifiers.

Figure 39:
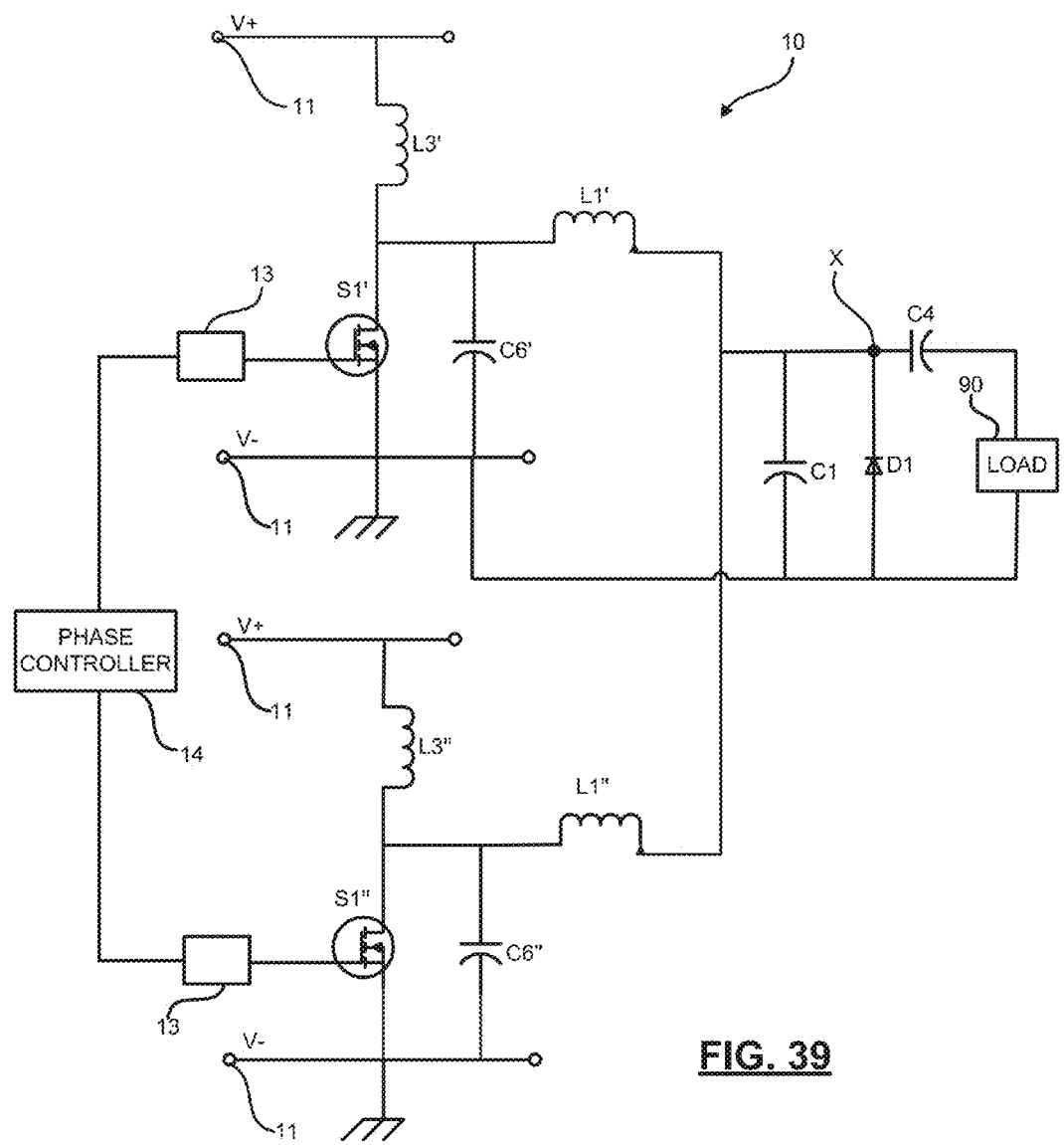
FIG. 39 illustrates a circuit depicting a pair of single-ended amplifiers arranged in a parallel configuration.

FIG. 39 depicts a pair of class E amplifiers arranged in a parallel configuration. The configuration of FIG. 39 is particularly directed to providing maximum power. With respect to FIGS. 37 and 38, in order to achieve maximum output power, switches S1A and S1B operate 180 degrees out-of-phase. For minimum output power in FIGS. 37 and 38, switches S1A and S1B operate in phase. With the design of FIG. 39, however, maximum output power is achieved when switches S1' and S1" operate in phase, and minimum power is achieved when S1' and S1" operate 180 degrees out-of-phase.

Figure 40:
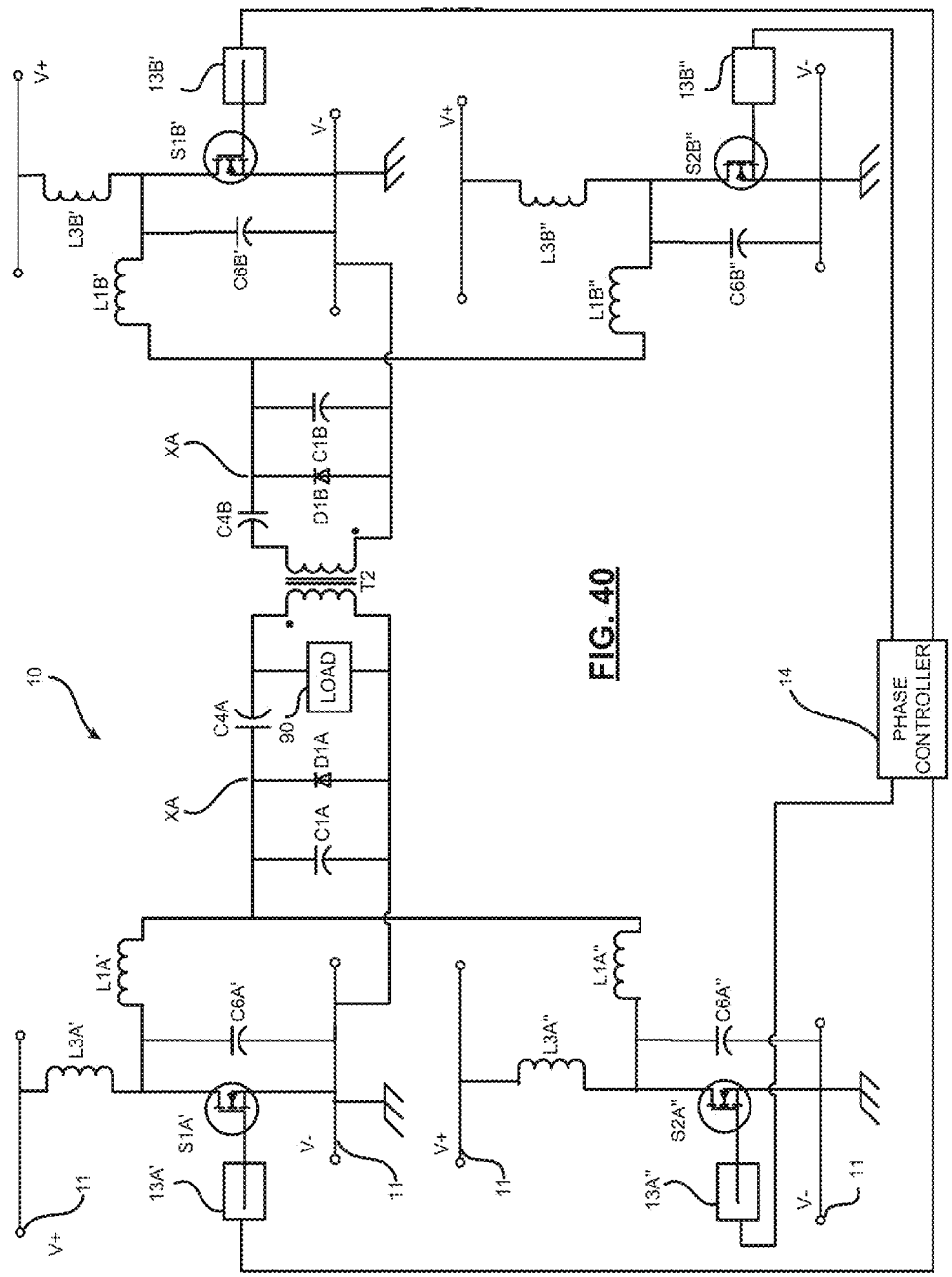
FIG. 40 illustrates a circuit depicting single-ended amplifiers arranged in a parallel, push-pull configuration.

FIG. 40 depicts a parallel, push-pull implementation of the single-ended amplifier. In particular, a first pair of amplifiers designate a first half of the push-pull configuration. The amplifiers comprise transistors S1A' and 52A" in series with inductors L3A' and L3A" between a pair of voltage rails. Each switch S1A' and 52A" is in parallel with respective capacitor C6A' and C6A". An inductor L1A', L1A" is placed at the output of each respective switch S1A' and S2A" and is applied to filter capacitor C1A in the first terminal. The other terminal C1A connects to ground. A clamping diode D1A is placed in parallel with capacitor C1A, and a blocking capacitor C4A is placed in series with load 90, the combination of which is in parallel with diode D1A. The second half of the push-pull configuration is similarly configured. Each half of the push-pull configuration is joined by a transistor T2, which operates as described above with respect to FIGS. 37 and 38.

Phase controller 14 generates output signals to each of a respective signal generator 13A', 13A", 13B', and 13B". Preferably, phase controller 14 operates each half of the push-pull configuration A, B 180 degrees out of phase. Within each half, phase controller 14 can vary the control signals sent to signal generators 13A', 13A" and 13B', and 13B". When signal generators 13A' and 13A" operate in phase, circuit half A of the push-pull configuration outputs maximum power, and when signal generators 13A' and 13A" operate out of phase, circuit half A outputs no power. Control signal generators 13B' and 13B" operate similarly. The circuit of FIG. 40 operates to eliminate even harmonics from the output of the single inverted configuration.

Figure 41:
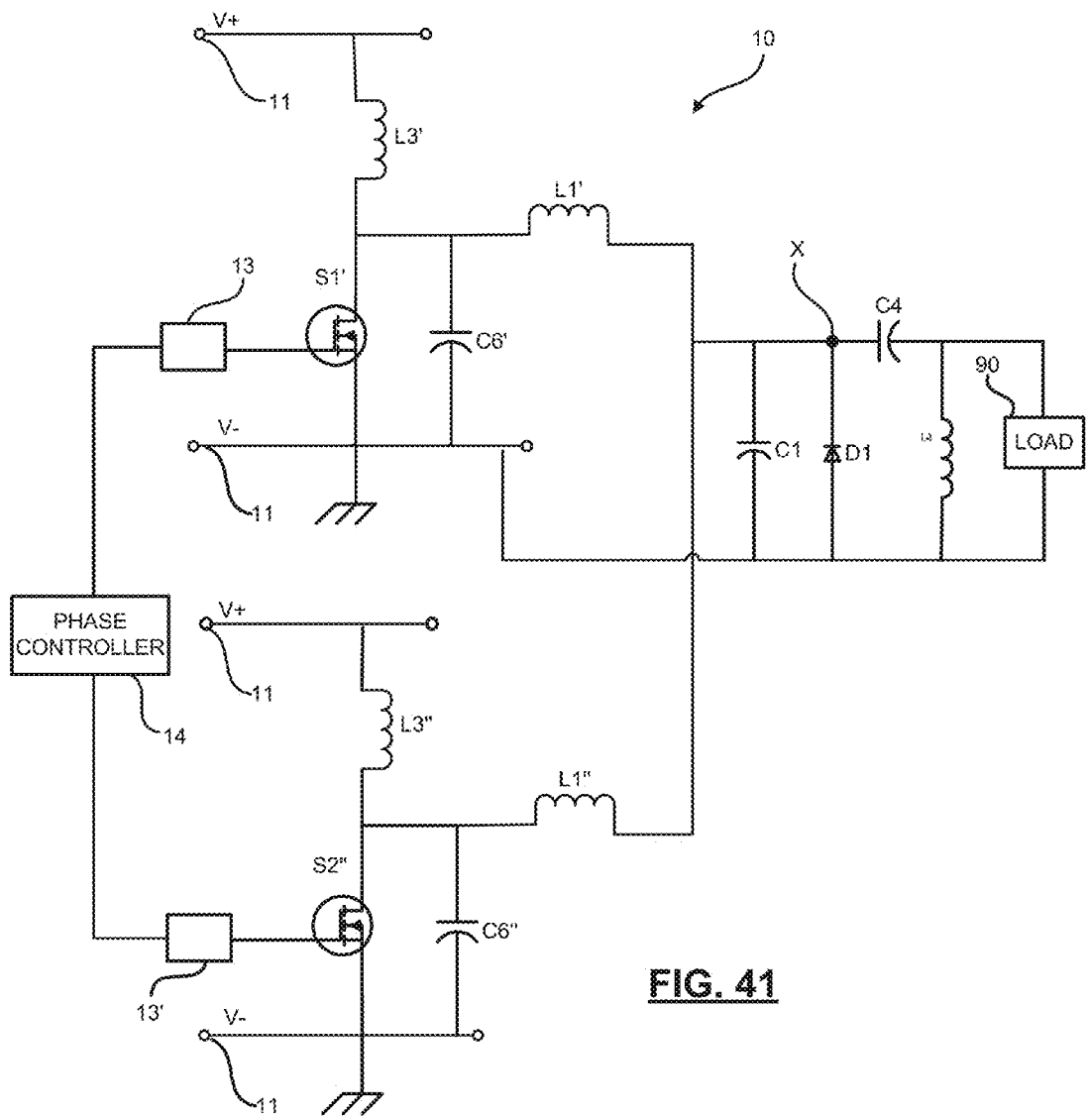
FIG. 41 illustrates a circuit depicting a pair of single-ended amplifiers arranged in parallel and having an additional filter at the output.

FIG. 41 depicts the circuit of FIG. 39, but modified to include an additional, inductor L4 in parallel with load 90. This configuration is useful when the desired load impedance is higher than the power amplifier output impedance. This configuration further helps to eliminate even harmonics. The configuration of FIG. 41 operates slowly as described with respect to FIG. 39 with the addition of inductive filter L4.

When load 90 contains a reactive component, it presents a particular consideration. When using the phase-shifting control, one of the switches S1' or S1" may experience a negative real impedance. The negative real impedance occurs as the circuit attempts to reflect energy delivered to it by the DC rail back to the DC rail through the switches S1' or S2". Such a condition could possibly damage the switches due to reverse recovery conditions within the intrinsic body diode. This problem may be corrected by using a MOSFET with a faster body diode, or a fast diode, such as a Schottky rectifier, with a low forward voltage drop place across the MOSFET.

With respect to particular component values, the class E amplifier shown in FIG. 33, it is generally desirable that diode D1 is barely activated, but does not conduct when the load 90 is properly matched. Capacitor C4 is a DC-blocking capacitor and should include a reactive impedance much less than the impedance of the load 90. Switch S1 possess a breakdown voltage which is at least five times the value of the positive DC rail voltage V+. Capacitor C6 possesses breakdown voltage at least three five times the value of the DC rail voltage V+. Inductors L1 and L2 have equal inductances, and capacitors C6 and C1 have equal capacitance values as well. The power P delivered to the load 90 is defined below in equation (1):

$$P = \frac{V^2}{2R} \quad (1)$$

where

V—voltage applied to rails 11; and
R—impedance of load 90.

The capacitance C of C6 and C1 is defined below in equation (2)

$$C = \frac{1}{p \cdot F_{op} \cdot R} \quad (2)$$

where $F_{op}$—operating frequency of the amplifier; and
R—impedance of load 90.

The inductance L of inductors L1 and L3 is defined below in equation (3)

$$L = \frac{R}{4 \cdot F} \quad (3)$$

where $F_{op}$—operating frequency of the class E amplifier; and
R—impedance of load 90.

The inductance values of inductor L1 and L3 need not be equal, and the capacitance values of C6 and C6 need not be equal. Further, inductor L3 and capacitor C6 may be adjusted to vary the Vds voltage waveform shown in FIG. 36. For instance, the peak voltage may be reduced, and the symmetry of the waveform of fake FIG. 36 may be improved by adjusting the values of inductor L1 and capacitor C1. However, such adjustments may adversely impact ZVS switching.

It will be understood by one skilled in the art that the circuit variations and substitutions discussed with respect to FIGS. 1-31 may be implemented in FIGS. 32-41 where appropriate as well.

The power supply circuits and/or one or more portions thereof shown in the following FIGS. 42-44 and 48-49 may be applicable to one or more portions of the circuits shown in FIGS. 3-9, 22, 29-30, 32-33 and 37-41. For example, each of the power supply circuits of FIGS. 42-44 may be applicable to all or a portion of the circuits of FIGS. 3-4. As another example, the power supply circuits of FIGS. 42-44 may be applicable to all or a portion of the circuit of FIG. 4, except for the signal sources 13A, 13B and the phase controller 14. The signal sources 13A, 13B and the phase controller 14 may be connected and/or modified to supply control (or drive) signals to switches of power amplifiers in FIGS. 42-44. In the following figures, voltage potentials V+, V− are shown. The voltage potentials are identified below as V+, V−.

In the following figures, circuit element identifiers are provided for circuit elements, such as C1, C2, C3, L1, T1, W1, W2, W3, etc. Circuit elements of different figures with the same identifier may be configured the same and have the same value or may be configured differently and have different values. For example, capacitance C2 of FIG. 42 may have a same or different capacitance than capacitance C2 of FIG. 43.

Also, in the following figures multiple rectifier and clamping circuits are disclosed. The rectifier and clamping circuits are interchangeable. For example, the rectifier and clamping circuit of FIG. 42 may be replaced with the rectifier and clamping circuit of FIG. 44 and vice versa. As another example, the rectifier and clamping circuit of FIG. 42 may replace the rectifier and clamping circuit of FIG. 47 and/or FIG. 48.

Figure 42:
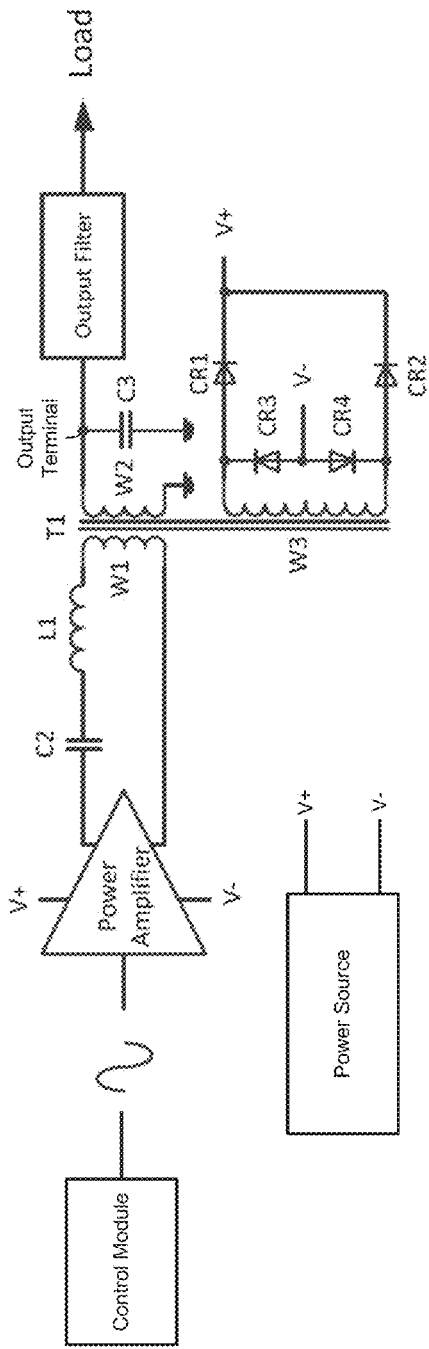
FIG. 42 illustrates a power supply circuit incorporating a power amplifier and an isolated quad-diode rectification and clamping circuit in accordance with the present disclosure.
Figure 43:
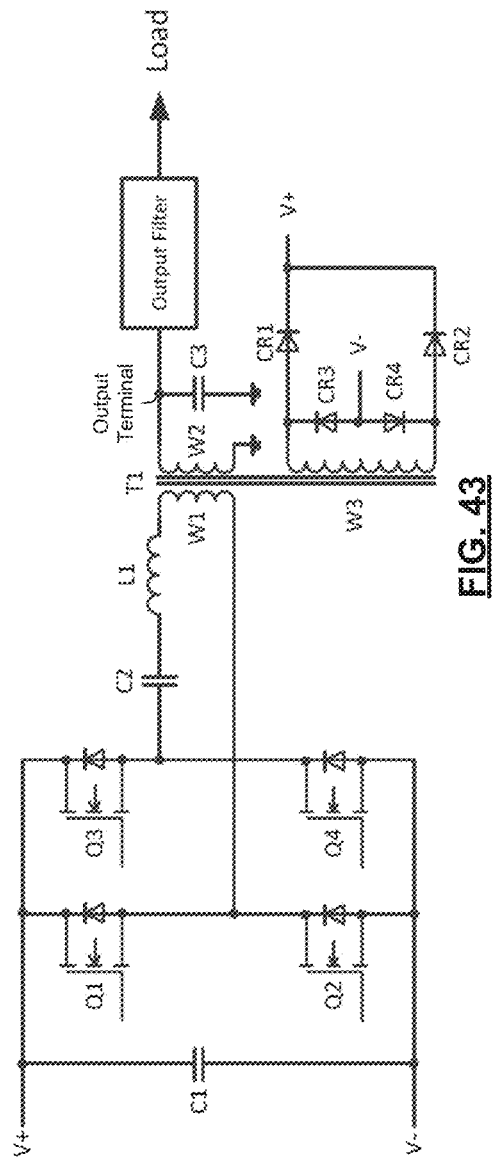
FIG. 43 illustrates another power supply circuit incorporating power amplifier switches and an isolated quad-diode rectification and clamping circuit in accordance with the present disclosure.

FIG. 42 shows a power supply circuit. The power supply circuit includes a power amplifier, a capacitance C2, an inductance L1, a transformer T1, a capacitance C3 and an output filter. The power amplifier is connected to a first power source and receives a direct current (DC) voltage across terminals having voltage potentials identified as V+ and V− (hereinafter the terminals are referred to as the terminals V+, V−). The power amplifier is also connected to a control module and receives one or more control (or drive) signals from the control module. The drive signals may be sinusoidal signals as shown, square wave signals, or digital signals and are used to control states of switches in the power amplifier. Examples of the switches are shown in FIG. 43.

The power amplifier includes two outputs, which output an alternating current (AC) output signal. The first output is connected to the capacitance C2. The capacitance C2 is a DC blocking capacitance. The capacitance C2, the inductance L1 and a primary winding of the transformer T1 are connected in series. The capacitance C2 and the inductance L1 are connected between (i) the first output of the power amplifier and (ii) a first end of a primary winding W1 of the transformer T1. A second end of the primary winding W1 is connected to the second output of the power amplifier.

The transformer includes the primary winding W1, a secondary winding W2, and an auxiliary (or third) winding W3. A first end of the secondary winding W2 is connected to an output terminal (or junction terminal), the capacitance C3, and an input of the output filter. A second end of the secondary winding is connected to a ground reference terminal. The capacitance C3 performs as a filter, is connected to the output terminal, and is connected (i) between the first end of the secondary winding W2 and the ground reference terminal, and (ii) between the output filter and the ground reference terminal. An output of the output filter is provided to a load (e.g., one of the loads described above). The input of the filter is connected to the output terminal. An output impedance of the output filter may match an input impedance of the load.

The auxiliary winding W3 is connected to a rectifier and clamping circuit. The rectifier and clamping circuit provides full wave rectification of a voltage at the output terminal and limits voltage at the output terminal. The rectifier and clamping circuit includes diodes CR1-CR4. A first end of the auxiliary winding W3 is connected to an anode of diode CR1 and a cathode of diode CR3. A second end of the third winding is connected to an anode of diode CR2 and a cathode of diode CR4. Anodes of the diodes CR3 and CR4 are connected to each other and to terminal V−, which is connected to the first power source and the power amplifier. The cathodes of the diodes CR1 and CR2 are connected to each other and to the terminal V+, which is connected to the first power source and the power amplifier.

During operation, if the rectified voltage provided by the rectifier and clamping circuit is greater than the voltage potential at the terminal V+, then one of the diode pairs CR1/CR4 or CR2/CR3 conducts and returns current back to the first power source. This provides voltage clamping and returns current back to the first power source, which limits voltage at the output terminal. This in turn limits output power and output current of the amplifier provided to the output filter and thus limits output power provided to the load. By limiting the voltage at the output terminal (or junction terminal connected to capacitance C3), excessive draw of current from the power amplifier is prevented. If the voltage across the auxiliary winding W3 is positive and greater than the voltage potential at the terminal V+ and the threshold voltage of diode CR1, then the diodes CR1 and CR4 conduct. If the voltage across the auxiliary winding W3 is negative and the magnitude of the voltage is greater than the voltage potential at the terminal V+ and the threshold voltage of diode CR2, then the diodes CR2 and CR3 conduct.

As an alternative to the configuration shown in FIG. 42, the outputs of the rectifier and clamping circuit may be connected to a second power source rather than being connected to the terminals V+, V− of the first power source. This allows a clamp voltage of the rectifier and clamping circuit to be set to levels other than voltage potentials V+ and V−. The power at the second power source may be supplied back to the first power source. This may occur via, for example, a converter circuit. In addition or as an alternative, the outputs of the rectifier and clamping circuit may be connected to a dissipation circuit including a resistance and/or a zener diode, which may be used to dissipate power received from the output terminal. The configurations of FIGS. 43-44 and 49-49 may also be modified to include a second power source and/or a dissipation circuit.

The rectifier and clamping circuit is an AC coupled circuit that is matched to one or more predetermined protection voltages. In other words, the rectifier and clamping circuit is configured to clamp the voltages at the output terminal to the predetermined protection voltages. For example, the clamp voltages at the output terminal may be (i) a sum of forward bias threshold voltages of the diode CR1 and the voltage potential V+ and (ii) the voltage potential V− minus a sum of the forward bias threshold voltage of the diode CR2. Thus, if the forward bias threshold voltages of the diodes are the same (e.g., Vt), then the voltage range at the output terminal is clamped to be between (Vt+V+) and (V−−Vt).

Winding ratios of the transformer T1 may be arbitrary or predetermined to provide proper clamping protection and thus properly limit the output voltage at the output terminal. The winding ratios of the transformer T1 include winding ratios (i) between coils W1, W2, and (ii) between W1, W3.

FIG. 43 shows another power supply circuit. The power supply circuit is similar to the power supply circuit of FIG. 42. FIG. 43 illustrates example switches Q1-Q4 of amplifiers that may be included in the power amplifier. The switches Q1-Q4 may be MOSFET switches. The power amplifier is a full bridge amplifier. The first half bridge amplifier includes the switches Q1, Q2. The second half bridge amplifier includes the switches Q3, Q4. The switches Q1, Q2 are connected in series between the terminals V+, V−. The switches Q3, Q4 are connected in series between the terminals V+, V−. The switches Q1, Q2 are connected in parallel with the switches Q3, Q4. A capacitance C1 may be connected in parallel with the switches Q1, Q2 and in parallel with the switches Q3, Q4. The switches Q1-Q4 are operated and the capacitance C1 and the switches Q1-Q4 are configured to convert the DC voltage provided at terminals V+, V− to an AC voltage. Each of the switches Q1-Q4 has a control input and receives a respective control (or drive) signal.

FIG. 44 shows another power supply circuit including a power amplifier (e.g., one of the power amplifiers of FIGS. 42-43), the capacitances C2, C3, the inductance L1, the transformer T1, the output filter, and a rectifier and clamping circuit. The transformer T1 includes the primary winding W1, the secondary winding W2 and an auxiliary winding W3. The rectifier and clamping circuit provides full wave rectification and clamps the voltage at the output terminal (or junction) between the first end of the secondary winding W2 of the transformer and the input of the output filter.

The rectifier and clamping circuit of FIG. 44 includes the diodes CR1, CR2. The rectifier and clamping circuit of FIG. 44, unlike the rectifier and clamping circuits of FIGS. 42, 43, does not include the diodes CR3 and CR4. Instead of the diodes CR3 and CR4, the auxiliary winding W3 includes a center tap that is connected to the terminal V−. Anodes of the diodes CR1, CR2 are connected respectively to ends of the auxiliary winding W3. Cathodes of the diodes CR1, CR2 are connected to the terminal V+. The configuration of the rectifier and clamping circuit reduces the number of the diodes from four to two over the rectifier and clamping circuits of FIGS. 42, 43 while providing the same or similar rectification and clamping protection.

The rectifier and clamping circuit of FIG. 44 is configured to clamp the voltages at the output terminal to the predetermined protection voltages.

FIG. 45 shows a conventionally known power supply circuit without the voltage rectification and clamping features described in FIGS. 41-43. The power supply circuit includes a power amplifier, a capacitance C2, an inductance L1, a transformer T1, a capacitance C3, and an output filter. The power amplifier receives a DC voltage via terminals V+, V− and a control (or drive) signal. The capacitance C2 is connected between a first output of the power amplifier and the inductance. The capacitance, the inductance and a primary winding of the transformer T are connected in series. A second end of the transformer T1 is connected to a second output of the power amplifier. An output terminal is connected between (i) a first end of a secondary winding of the transformer T1 and (ii) an input of the output filter. A second end of the secondary winding is connected to a ground reference. The capacitance C3 is connected between the output terminal and the ground reference. An output of the output filter is connected to a load.

Figure 46:
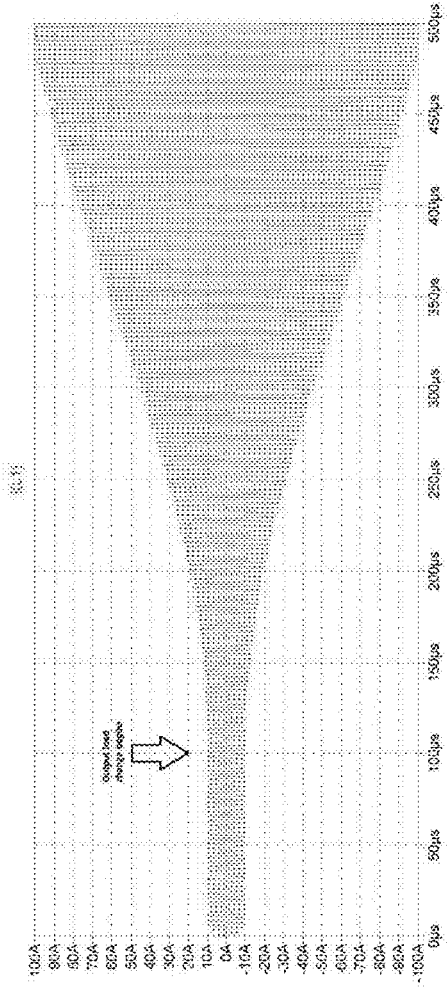
FIG. 46 is an example plot of output current of a power amplifier for the power supply circuit of FIG. 45 resulting from load impedance changes without clamping diode protection.

FIG. 46 shows an example simulation plot for the power supply circuit of FIG. 45. The simulation plot shows changes in output current of the power amplifier of FIG. 45 over time due to changes in the corresponding load. In an unprotected power supply circuit, as the power supply circuit of FIG. 45, where an auxiliary winding and a diode clamping circuit are not provided, voltage at the output terminal (or junction) can increase. The voltage can increase to a level that can cause damage to the power amplifier.

For the simulation of the simulation plot of FIG. 46, impedance of the load starts to increase at 100 μs, which causes output current of the power amplifier to increase. The simulation plot shows current out of the power amplifier continuing to increase to at least 500 μs. This can lead to excessive dissipation and potentially failure of the power amplifier and thus failure of the power supply circuit.

Figure 47:
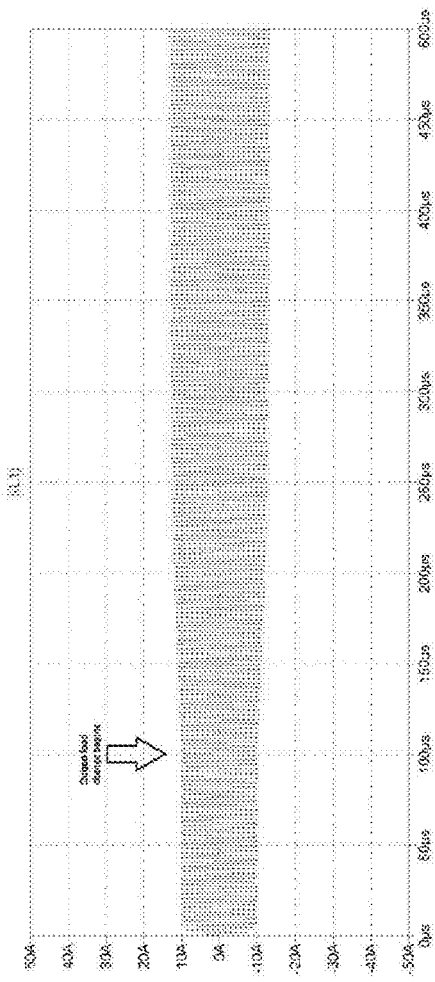
FIG. 47 is an example plot of output current of a power amplifier for the power supply circuit of FIG. 42 resulting from load impedance changes with clamping diode protection in accordance with the present disclosure.

FIG. 47 shows an example simulation plot of output current of the power amplifier for the power supply circuit of FIG. 42. The plot shows changes in output current of the power amplifier of FIG. 42 over time due to changes in the corresponding load. The load impedance starts to increases at 100 μs. Since the power supply circuit of FIG. 42 includes the rectifier and clamping circuit the output current of the power amplifier is clamped and does not continue to increase, but rather is limited. Although the output current increases due to the change in impedance of the load, the output current is clamped to not exceed a predetermined level of current. With aid of the rectifier and clamping circuit, the output current of the power amplifier increase slightly and reaches a peak limit quickly regardless of the impedance of the load. The output current levels off and remains in a safe operating range.

Figure 48:
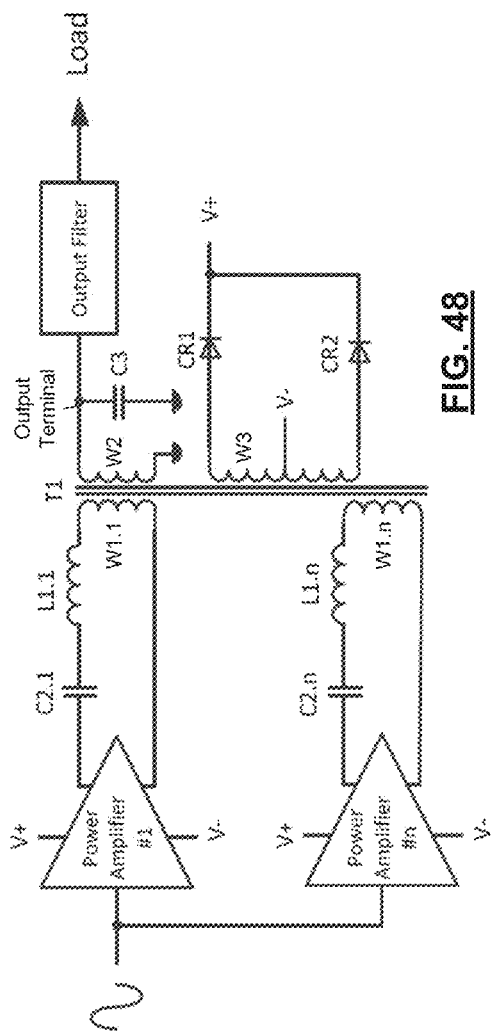
FIG. 48 illustrates a power supply circuit incorporating in-phase power amplifiers and an isolated dual-diode rectification and clamping circuit while providing power amplifier output voltage combining.

FIG. 48 shows a power supply circuit incorporating in-phase power amplifiers and a rectifier and clamping circuit while providing power amplifier output voltage combining. The power supply circuit includes power amplifiers1-$n$, a transformer T1, a capacitance C3, an output filter, and a rectifier and clamping circuit. The power amplifiers1-$n$ may operate and/or be configured similar to other power amplifiers (e.g., one or more of the power amplifiers of FIGS. 42-44) disclosed above. The power amplifiers1-$n$ receive a DC voltage from a power source via respective pairs of terminals V+, V−. Each of the power amplifiers1-$n$ may receive a same control (or drive) signal or a same set of control (or drive) signals. This causes the switches of each of the power amplifiers1-$n$ to operate in-phase with the corresponding switches of each other one of the power amplifiers1-$n$.

The power amplifiers1-$n$ include respective first outputs and second outputs. The first outputs are connected to respective capacitances C2.1-C2.$n$. The capacitances C2.1-C2.$n$ are connected in series with respective inductances L1.1-L1.$n$ and primary coils of the transformer T1. The inductances L1.1-L1.$n$ are connected between the capacitances C2.1-C2.$n$ and first ends of the primary coils W1.1-W1.$n$. The second outputs of the power amplifiers1-$n$ are connected to second ends of the primary coils W1.1-W1.$n$.

The transformer includes windings W1.1-W1.$n$, W2, W3. A first end of the secondary winding W2 is connected to an output terminal, the capacitance C3 and the output filter. A second end of the secondary winding and the capacitance are connected to a ground reference. The output filter is connected to and transfers filtered power to a load.

The power supply circuit includes a single rectifier and clamping circuit for multiple power amplifiers1-$n$. This minimizes the circuit elements while providing protection for all of the power amplifiers1-$n$. The rectifier and clamping circuit includes the auxiliary winding W3, a first diode CR1, and a second diode CR2. A first end of the auxiliary winding W3 is connected to an anode of the first diode CR1. A second end of the auxiliary winding W3 is connected to an anode of the second diode CR2. Cathodes of the diodes CR1, CR2 may be connected to positive terminal of the power source and/or to terminals V+ of the power amplifiers1-$n$. The auxiliary winding W3 includes a center tap, which may be connected to a negative terminal of the power source and/or to terminals V− of the power amplifiers1-$n$. The outputs of the rectifier and clamping circuit, provided at the cathodes of the diodes CR1, CR2 and the center tap, may be connected to a different power source than the power source connected to the power amplifiers1-$n$.

In operation, the transformer T1 combines the power received at the primary coils W1.1-W1.$n$ from the power amplifiers1-$n$. The combined power is primarily provided to a secondary coil W2. Some of the combined power may be supplied to the rectifier and clamping circuit. This is especially true when a voltage at an output terminal is greater than or equal to (Vt+V+) or less than or equal to V−−Vt, where Vt is a forward bias threshold voltage of each of the diodes CR1, CR2.

The configuration of the power supply circuit allows the combining of multiple RF sources (i.e. combining of output power from multiple power amplifiers) to a common load such that the power of each source is additively combined and provided at the output terminal. This provides efficient combining without use of a power dissipation element and while providing mutual isolation under multiple operating modes. The modes may include a normal operation mode, a clamping mode, and a power amplifier failure mode. During the normal operation mode, the power (or current) out of the power amplifiers1-$n$ (or RF sources) is added coherently via the transformer T1. During the clamping mode, power combining is provided while clamping the voltage at the output terminal. During the amplifier failure mode, one or more of the power amplifiers1-$n$ may have failed, such that there is a short circuit condition or an open circuit condition at the failed power amplifiers. Due to the failed power amplifiers, the voltage at the output terminal may increase or decrease from a voltage provided during the normal operation mode. If a magnitude of the voltage at the output terminal increases to a predetermined level, a corresponding one or more of the diodes of the rectifier and clamping circuit are forward conducting and return the increased energy back to the power source. This protects the one or more power amplifiers that have not failed.

Figure 49:
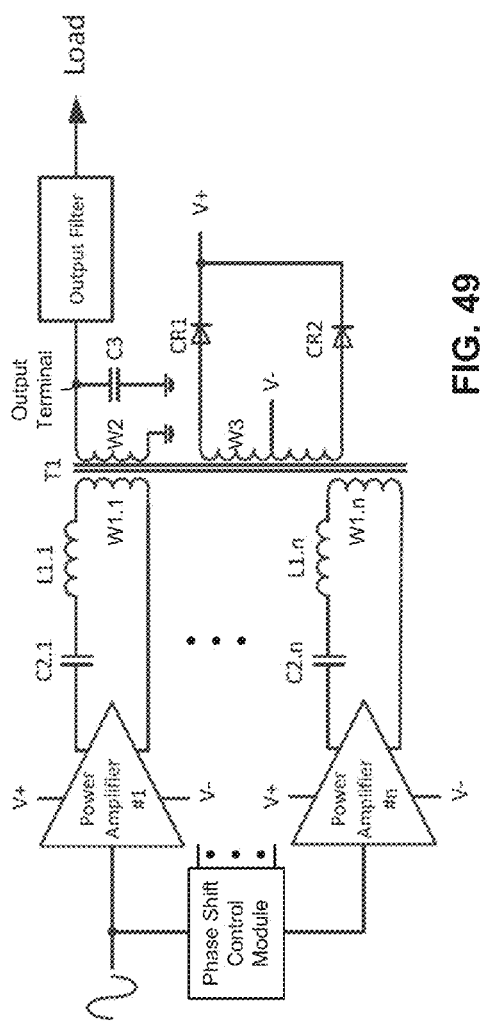
FIG. 49 illustrates a power supply circuit incorporating out-of-phase power amplifiers and an isolated dual-diode rectification and clamping circuit while providing power amplifier output voltage combining.

FIG. 49 shows a power supply circuit incorporating out-of-phase power amplifiers and an isolated dual-diode rectification and clamping circuit while providing power amplifier output voltage combining. The power supply circuit of FIG. 49 is similar to the power amplifier circuit of FIG. 48 and includes the power amplifiers1-$n$, the capacitances C2.1-C2.$n$, the inductances L1.1-L1.$n$, the transformer T1, the capacitance C3, the output filter and the rectifier and clamping circuit.

Unlike the power supply circuit of FIG. 48, the power supply circuit of FIG. 49 includes an input terminal that is connected to a phase shift control module. The phase shift control module may have any number of outputs, which are connected to respective power amplifiers. The phase shift control module phase shifts one or more control (or drive) signals received at the input terminal and supplies the phase shift signals to the power amplifiers2-$n$. The phase shift control module controls phase shift relationships between output signals of the power amplifiers, which in turn controls combining aspects of the output signals. The output signals of the power amplifiers2-$n$ may be between −180-180° out-of-phase with respect to an output signal of the power amplifier1. The output signals of the power amplifiers2-$n$ may be phase shifted a same or a different amount from the output signal of the power amplifier1. The more out-of-phase two of the output signals of the power amplifiers are, the more the two output signals cancel each other. The more in-phase two of the output signals of the power amplifiers are, the more the signals add together to provide increased power.

Although a single control (or drive) signal is shown as being supplied to the power amplifiers of FIGS. 48-49, any number of control (or drive) signals may be supplied to each of the power amplifiers. As an example, each of the power amplifiers may include four switches as shown in FIG. 43. The switches may receive respective control (or drive) signals. In this example, each of the power amplifiers receives four control (or drive) signals. As another example and referring to FIG. 43, switches Q1, Q3 may receive a first control (or drive) signal. Switches Q2, Q4 may receive a second control (or drive) signal.

Also, for the configurations of FIGS. 48-49, the integer value n may be greater than or equal to 2. In one embodiment, n is limited to 2 or 3. In another embodiment, n is limited to an even number.

The rectifier and clamping circuits of FIGS. 42-44 and 48-49 may perform as rectifiers when output impedances of the power supply circuits match impedances of the loads. The rectifier and clamping circuits of FIGS. 42-44 and 48-49 may perform both rectification and voltage clamping when the output impedances of the power supply circuits do not match impedances of the loads.

The above described examples provide power amplifier protection during mismatch load conditions. Mismatch load conditions refer to when the output impedance of a power supply circuit does not match an impedance of a load. The power supply circuits include rectifier and clamping circuits that can be matched to a proper (or predetermined) protection voltage by, for example, adjusting winding ratios of the transformers. The voltage clamping protection is provided in an isolated manner and in an AC current path, rather than being provided in a DC current path. For example, the rectifier and clamping circuits of FIGS. 42-44 and 48, 49 are provided subsequent to DC-to-AC conversion of supplied power and downstream from a transformer. This provides increased flexibility in clamping voltage control and minimizes circuit components (e.g., minimizes number of diodes used for voltage clamping purposes). Clamping voltage control is not only provided for the voltage range between 0–V+, but is also provided for the voltage range between V--0. This allows for adjusting AC voltage swings and clamping.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

Also, various terms are used to describe the physical relationship between components. When a first element is referred to as being "connected to", "engaged to", or "coupled to" a second element, the first element may be directly connected, engaged, disposed, applied, or coupled to the second element, or intervening elements may be present. In contrast, when an element is referred to as being "directly connected to", "directly engaged to", or "directly coupled to" another element, there may be no intervening elements present. Stating that a first element is "connected to", "engaged to", or "coupled to" a second element implies that the first element may be "directly connected to", "directly engaged to", or "directly coupled to" the second element. Other words used to describe the relationship between elements should be interpreted in a like fashion (e.g., "between" versus "directly between", "adjacent" versus "directly adjacent", etc.).

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc.

The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35

U.S.C. §112(f) unless an element is expressly recited using the phrase "means for", or in the case of a method claim using the phrases "operation for" or "step for".

What is claimed is:

1. A power supply circuit comprising:
   a power amplifier configured to
   receive (i) a direct current (DC) voltage from a first power source, and (ii) a control signal, and
   based on the control signal, convert the DC voltage to an alternating current (AC) output signal;
   a transformer comprising a first winding, a second winding, and a third winding, wherein the first winding is configured to receive the AC output signal, wherein the second winding is configured to receive an output current based on the AC output signal, and wherein the second winding supplies AC current to an output terminal and the output terminal supplies AC current to the load via an output filter and wherein the output terminal receives power reflected from the load; and
   a rectifier and clamping circuit comprising a plurality of diodes, wherein the diodes are configured to (i) rectify a voltage across the third winding, (ii) clamp a voltage at the output terminal, and (iii) return power from the third winding to the first power source or a second power source.

2. The power supply circuit of claim 1 wherein the first winding is a primary winding, the second winding is a secondary winding, and the third winding is a tertiary winding.

3. The power supply circuit of claim 1 wherein the plurality of diodes further comprises four diodes arranged in a diode bridge rectifier configuration.

4. The power supply circuit of claim 3 wherein the four diodes are arranged in an isolated quad-diode rectifier configuration.

5. The power supply circuit of claim 1 wherein the plurality of diodes further comprises a pair of diodes arranged in a full wave bridge rectifier configuration.

6. The power supply circuit of claim 5 wherein the plurality of diodes further comprises a pair of diodes arranged in an isolated dual-diode rectifier configuration.

7. The power supply circuit of claim 1 further comprising:
   a second power amplifier configured to
   receive (i) a direct current (DC) voltage from a first power source, and (ii) a second control signal, and
   based on the second control signal, convert the DC voltage to a second alternating current (AC) output signal, and
   wherein the transformer further comprises a fourth winding, wherein the fourth winding is configured to receive the second AC output signal.

8. The power supply circuit of claim 7 wherein the control signal and the second control signal operate the respective first power amplifier in-phase with the second power amplifier.

9. The power supply circuit of claim 1 wherein the power amplifier includes a plurality of switches arranged in a full bridge configuration.

10. The power supply circuit of claim 7 wherein the control signal and the second control signal operate the respective first power amplifier out-of-phase with the second power amplifier.

11. A power supply circuit comprising:
    a power amplifier configured to receive a direct current (DC) voltage from a first power source and convert the DC voltage to an alternating current (AC) output signal;
    a transformer comprising a first winding, a second winding, and a third winding, wherein the first winding is configured to receive the AC output signal, wherein the second winding is configured to receive an output current based on the AC output signal, and wherein the second winding supplies an AC current to an output terminal and the output terminal supplies AC current to the load via an output filter and wherein the output terminal receives power reflected from the load; and
    a rectifier and clamping circuit comprising a plurality of diodes, wherein the diodes are configured to at least two of rectify a voltage across the third winding, clamp a voltage at the output terminal, and return power from the third winding to the first power source or a second power source.

12. The power supply circuit of claim 11 wherein the first winding is a primary winding, the second winding is a secondary winding, and the third winding is a tertiary winding.

13. The power supply circuit of claim 11 wherein the plurality of diodes further comprises four diodes arranged in a diode bridge rectifier configuration.

14. The power supply circuit of claim 13 wherein the four diodes are arranged in an isolated quad-diode rectifier configuration.

15. The power supply circuit of claim 11 wherein the plurality of diodes further comprises a pair of diodes arranged in a full wave bridge rectifier configuration.

16. The power supply circuit of claim 15 wherein the plurality of diodes further comprises a pair of diodes arranged in an isolated dual-diode rectifier configuration.

17. The power supply circuit of claim 11 further comprising:
    a second power amplifier configured to receive a direct current (DC) voltage from a second power source and convert the DC voltage to a second alternating current (AC) output signal, and
    wherein the transformer further comprises a fourth winding, wherein the fourth winding is configured to receive the second AC output signal.

18. The power supply circuit of claim 17 wherein the power amplifier operates in-phase or out-of-phase with the second power amplifier.

19. The power supply circuit of claim 17 wherein the power amplifier and the second power amplifier are separate units.

20. The power supply circuit of claim 17 wherein the power amplifier and the second power amplifier are the same units.

21. A power supply circuit comprising:
    a means for receiving a direct current (DC) voltage from a first power source and converting the DC voltage to an alternating current (AC) output signal;
    a means for transforming including a first winding, a second winding, and a third winding, wherein the first winding receives the AC output signal, wherein the second winding receives an output current based on the AC output signal, and wherein the second winding supplies AC current to an output terminal and the output terminal supplies AC current to the load via an output filter and wherein the output terminal receives power reflected from the load; and
    a rectifier and clamping means including a plurality of diodes arranged to at least two of rectify a voltage across the third winding, clamp a voltage at the output terminal, and return power from the third winding to the first power source or a second power source.

22. The power supply circuit of claim 21 wherein the plurality of diodes further comprises four diodes arranged in a diode bridge rectifier configuration.

23. The power supply circuit of claim 21 wherein the plurality of diodes further comprises a pair of diodes arranged in a full wave bridge rectifier configuration.

24. The power supply circuit of claim 21 further comprising:
- a second means for receiving a direct current (DC) voltage from a second power source and converting the DC voltage to a second alternating current (AC) output signal, and
- wherein the means for transforming further comprises a fourth winding, wherein the fourth winding is configured to receive the second AC output signal.

25. The power supply circuit of claim 24 wherein the means for receiving operates in-phase with the second means for receiving.

26. The power supply circuit of claim 24 wherein the means for receiving and the second means for receiving are the same units.

27. The power supply circuit of claim 24 wherein the means for receiving operates out-of-phase with the second means for receiving.

28. The power supply circuit of claim 24 wherein the means for receiving and the second means for receiving are separate units.

* * * * *